(12) United States Patent
Higashi et al.

(10) Patent No.: US 11,747,184 B2
(45) Date of Patent: Sep. 5, 2023

(54) THERMOPILE-BASED FLOW SENSING DEVICE

(71) Applicant: Honeywell International Inc., Morris Plains, NJ (US)

(72) Inventors: Robert Higashi, Shorewood, MN (US); Scott Edward Beck, Murphy, TX (US); Yong-Fa Wang, Frisco, TX (US); Ian Bentley, New Ipswich, NH (US); Bill Hoover, Plain City, OH (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days.

(21) Appl. No.: 16/992,411

(22) Filed: Aug. 13, 2020

(65) Prior Publication Data

US 2020/0370938 A1 Nov. 26, 2020

Related U.S. Application Data

(63) Continuation of application No. 16/389,647, filed on Apr. 19, 2019, now Pat. No. 10,775,217.

(51) Int. Cl.
*G01F 1/688* (2006.01)
*G01F 1/684* (2006.01)
(Continued)

(52) U.S. Cl.
CPC .......... *G01F 1/6888* (2013.01); *G01F 1/6847* (2013.01); *H10N 10/851* (2023.02); *H10N 19/00* (2023.02)

(58) Field of Classification Search
CPC .... G01F 1/6888; G01F 1/6847; G01F 1/6845; G01F 1/68; G01F 1/684; H01L 27/16; H01L 35/14; G01K 13/02
See application file for complete search history.

(56) References Cited

U.S. PATENT DOCUMENTS 4,651,564 A 3/1987 Johnson et al.
5,393,351 A 2/1995 Kinard et al.
(Continued)

FOREIGN PATENT DOCUMENTS

CN 101078641 A 11/2007
CN 109798944 A 5/2019
(Continued)

OTHER PUBLICATIONS

Extended European Search Report issued in European Application No. 20168100.4, dated Sep. 15, 2020 (8 pages).
Notice of Allowance and Fees Due (PTOL-85) dated Jul. 1, 2020 for U.S. Appl. No. 16/389,647.
Notice of Allowance and Fees Due (PTOL-85) dated Jun. 29, 2020 for U.S. Appl. No. 16/389,647.
(Continued)

*Primary Examiner* — Herbert K Roberts
*Assistant Examiner* — Anthony W Megna Fuentes
(74) *Attorney, Agent, or Firm* — Alston & Bird LLP

(57) ABSTRACT

Example systems, apparatuses, and methods are disclosed sensing a flow of fluid using a thermopile-based flow sensing device. An example apparatus includes a flow sensing device comprising a heating structure having a centerline. The flow sensing device may further comprise a thermopile. At least a portion of the thermopile may be disposed over the heating structure. The thermopile may comprise a first thermocouple having a first thermocouple junction disposed upstream of the centerline of the heating structure. The thermopile may further comprise a second thermocouple having a second thermocouple junction disposed downstream of the centerline of the heating structure.

19 Claims, 33 Drawing Sheets

(51) Int. Cl.
  *H10N 10/851* (2023.01)
  *H10N 19/00* (2023.01)

(56) References Cited

U.S. PATENT DOCUMENTS

| | | | |
|---|---|---|---|
| 5,705,745 A | 1/1998 | Treutler et al. | |
| 6,035,711 A | 3/2000 | Huijsing et al. | |
| 6,238,085 B1 | 5/2001 | Higashi et al. | |
| 6,550,324 B1 | 4/2003 | Mayer et al. | |
| 6,684,694 B2 * | 2/2004 | Fujiwara | G01F 1/6845 73/204.26 |
| 6,763,710 B2 | 7/2004 | Mayer et al. | |
| 7,278,309 B2 | 10/2007 | Dmytriw et al. | |
| 7,490,511 B2 | 2/2009 | Mayer et al. | |
| 8,011,240 B2 * | 9/2011 | von Waldkirch | G01F 1/6845 73/204.26 |
| 8,356,514 B2 | 1/2013 | Wang et al. | |
| 8,590,373 B1 | 11/2013 | Van Bavel | |
| 8,809,980 B2 | 8/2014 | Nakatani | |
| 9,664,545 B2 | 5/2017 | Knittel et al. | |
| 10,094,691 B2 | 10/2018 | Figi et al. | |
| 2012/0071783 A1 | 3/2012 | Klee et al. | |
| 2012/0152014 A1 | 6/2012 | Speldrich | |
| 2016/0161951 A1 | 6/2016 | Hornung et al. | |
| 2016/0216144 A1 * | 7/2016 | Figi | G01F 1/6888 |
| 2017/0102255 A1 | 4/2017 | Harada et al. | |

FOREIGN PATENT DOCUMENTS

| | | | | |
|---|---|---|---|---|
| CN | 110418944 A | 11/2019 | | |
| EP | 3404373 A1 * | 11/2018 | | G01F 1/6888 |
| EP | 3726187 A1 | 10/2020 | | |
| JP | 3589083 B2 | 11/2004 | | |
| WO | 2018/124553 A1 | 7/2018 | | |
| WO | 2018/134553 A1 | 7/2018 | | |

OTHER PUBLICATIONS

Notice of Allowance and Fees Due (PTOL-85) dated May 13, 2020 for U.S. Appl. No. 16/389,647.
Wrbanek, John D. et al., "Development of Thin Film Ceramic Thermocouples for High Temperature Environments," NASA/TM-2004-213211, AIAA-2004-3549, (2004).
U.S. Appl. No. 16/389,647, filed Apr. 19, 2019, U.S. Pat. No. 10,775,217, Granted.
Examination Report issued in Australian Application No. 2020202417 dated Feb. 26, 2021, 6 pages.
First Office Action issued in Chinese Application No. 202010311039.0 dated Dec. 28, 2021, 12 pages.
AU Office Action dated Jan. 19, 2022 for AU Application No. 2020202417.
CN Office Action dated May 23, 2022 for CN Application No. 202010311039.
Communication about intention to grant a European patent dated Jul. 22, 2022 for EP Application No. 20168100.
English Translation of CN Office Action dated May 23, 2022 for CN Application No. 202010311039.
3rd Office Action for China Application No. 202010311039.0.
AU Office Action dated Feb. 2, 2023 for AU Application No. 2022201312.
Decision to grant a European patent dated Jan. 5, 2023 for EP Application No. 20168100.
CN Notice of Allowance dated Mar. 19, 2023 for CN Application No. 202010311039, 2 page(s).
English translation of CN Notice of Allowance dated Mar. 19, 2023 for CN Application No. 202010311039, 2 page(s).
CN Office Action dated Dec. 28, 2022 for CN Application No. 202010311039.
European search report dated May 30, 2023 for EP Application No. 23151913, 5 page(s).

* cited by examiner

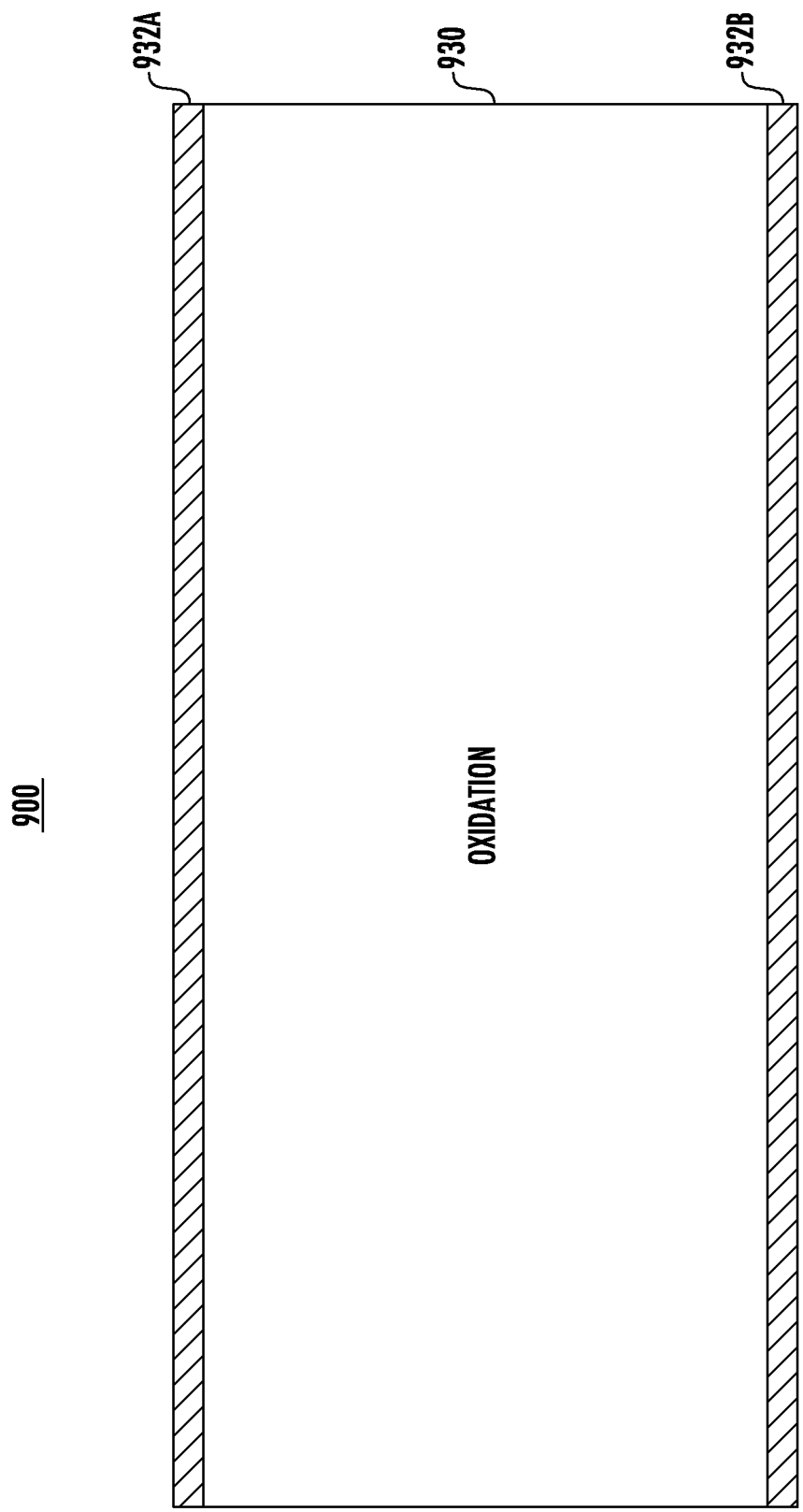

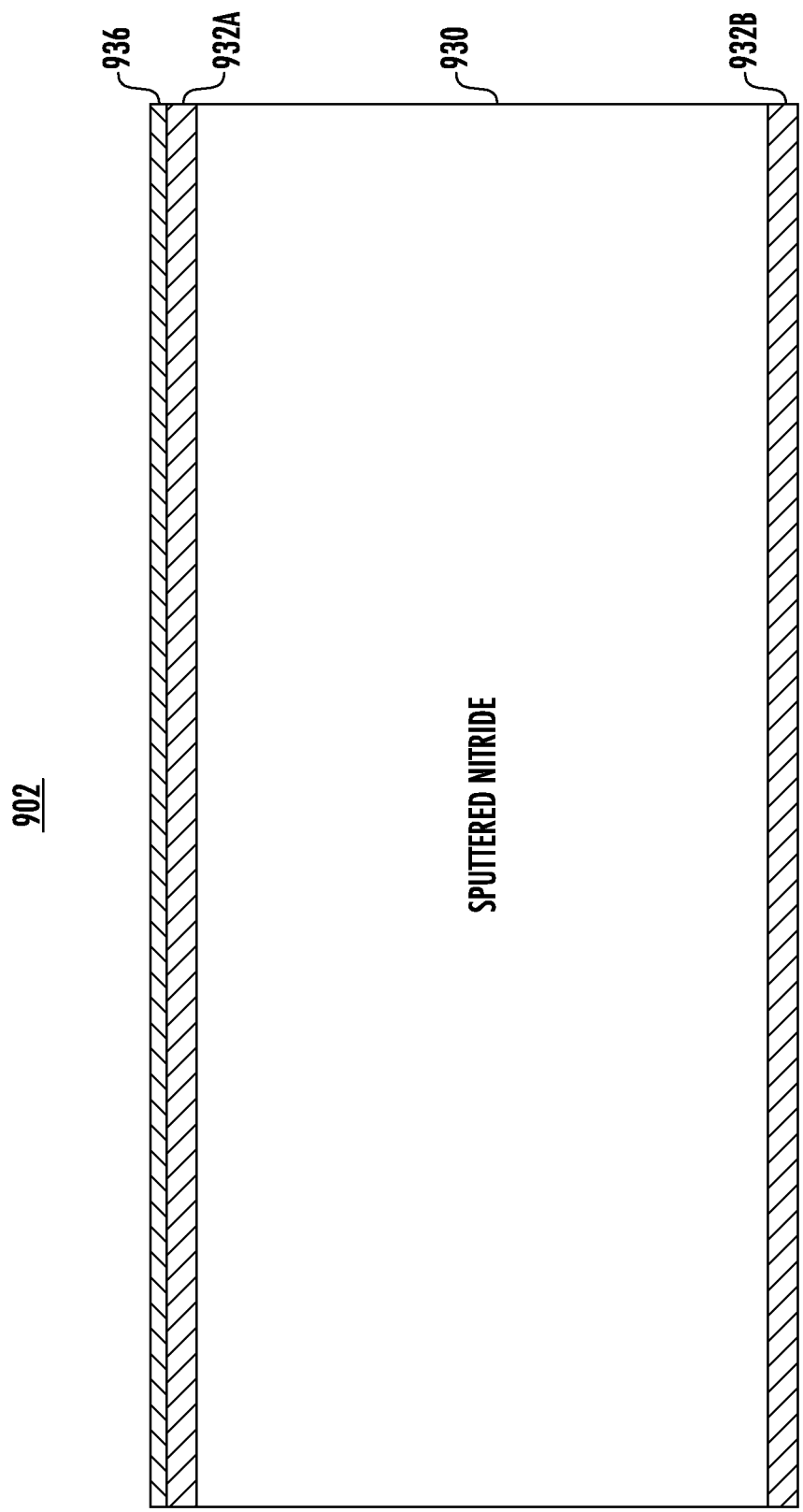

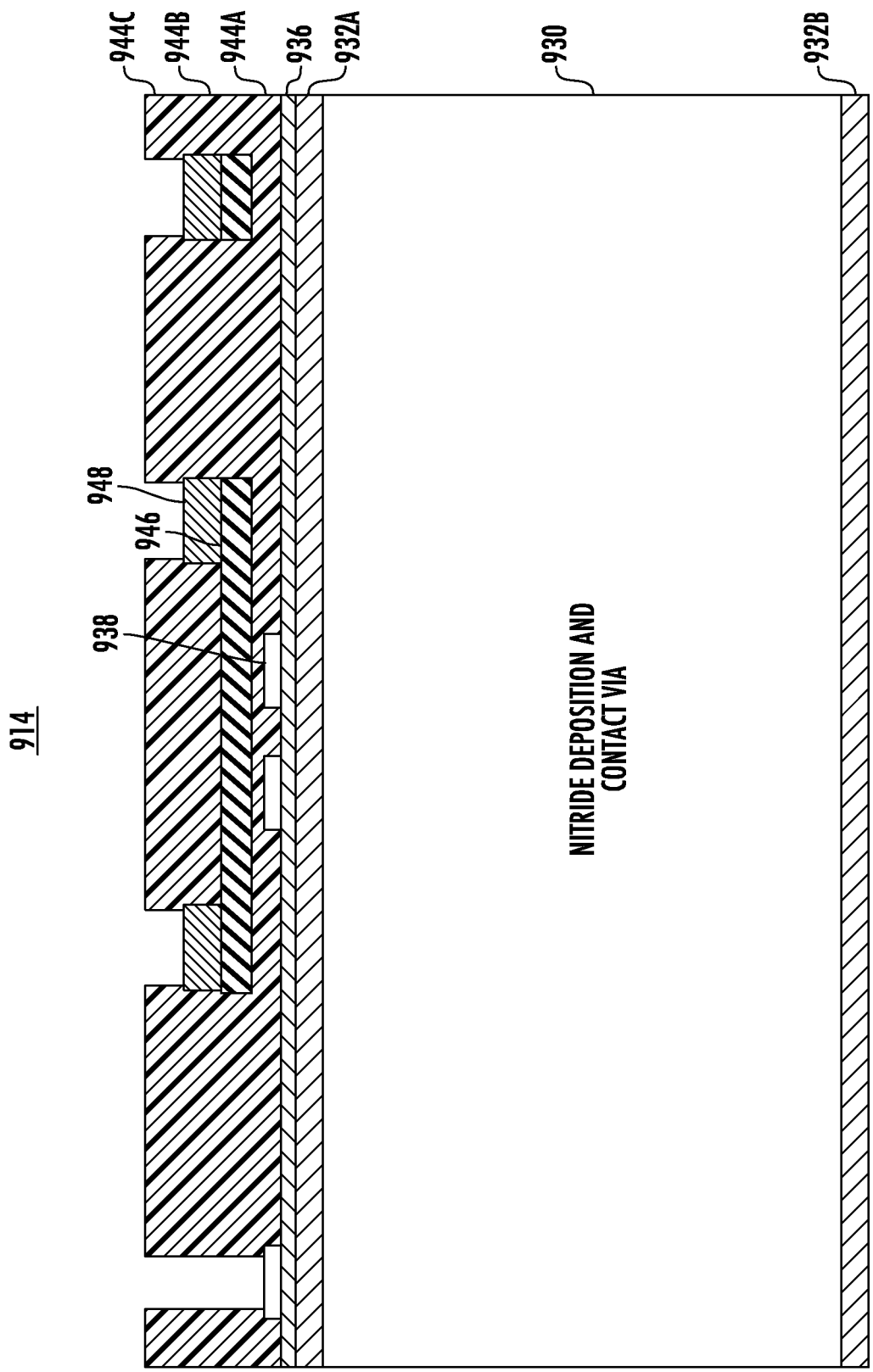

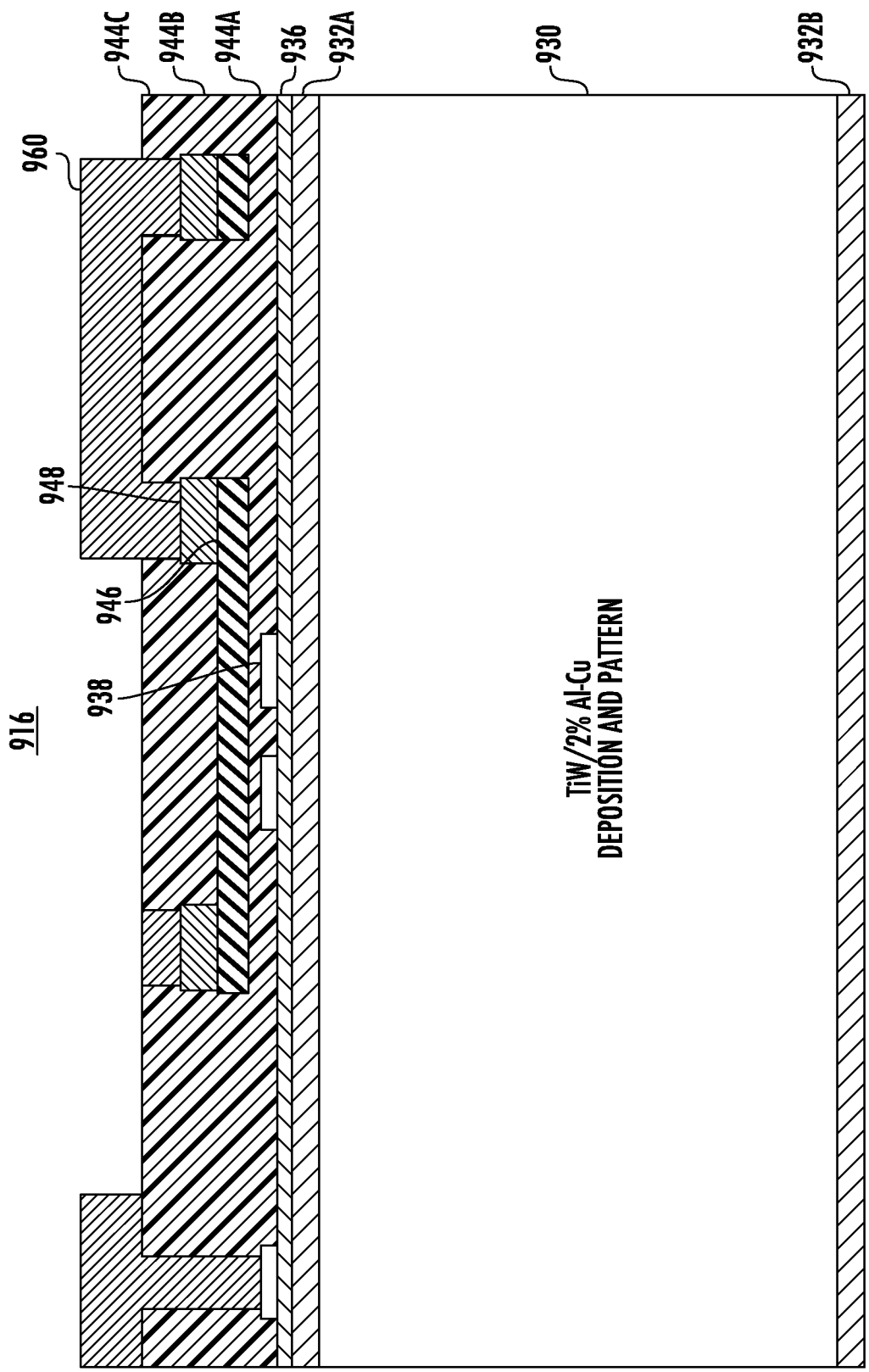

| MATERIAL | TEMP (K) | TE (uV/C) | rho (uohm-cm) | COMMENTS |
|---|---|---|---|---|
| nPOLY Si | 300 | -65 | 800 | TE PROPERTY CHANGES WITH DOPING LEVEL. |
| AuNi(9%) | 300 | -55 | 11 | |
| NiFe(40%) | 300 | -45 | 20 | |
| Co | 300 | -31 | 6 | |
| Ni | 300 | -19 | 8 | |
| Ta | | -1.9 | 12.45 | |
| Pt | 273 | 0 | 10.6 | |
| Al | 273 | 3.5 | 2.6548 | |
| Ta | 273 | 4.5 | 12.45 | |
| Ag | 273 | 6.5 | 1.59 | |
| Cu | 273 | 6.5 | 1.673 | |
| Au | 273 | 6.5 | 2.35 | |
| W | 273 | 7.5 | 5.65 | |
| Cu | 300 | 7.6 | | |
| Ti | | 9.1 | 42 | |
| NiCr(2%) | 300 | 20 | 16 | |
| Cr | 300 | 22 | 13 | |
| NiCr(10%) | 300 | 25 | 70 | |
| pPOLY Si | 300 | 135 | 5500 | TE PROPERTY CHANGES WITH DOPING LEVEL. |
| p-Si | 300 | 220 | 13000000 | TE PROPERTY CHANGES WITH DOPING LEVEL. |
| p-Si | 200 | 1000 | 3000000 | TE PROPERTY CHANGES WITH DOPING LEVEL. |
| p-Si | 77 | 20000 | 300000 | |

```
┌─────────────────────────────────────────────────┐
│  PROVIDING A HEATING STRUCTURE HAVING A CENTERLINE │──1202
└─────────────────────────────────────────────────┘
                        │
                        ▼
┌─────────────────────────────────────────────────┐
│  DISPOSING A PORTION OF A THERMOPILE OVER THE HEATING │
│  STRUCTURE, WHEREIN THE THERMOPILE COMPRISES A FIRST │
│  THERMOCOUPLE HAVING A FIRST THERMOCOUPLE JUNCTION │──1204
│  DISPOSED UPSTREAM OF THE CENTERLINE, AND WHEREIN THE │
│  THERMOPILE FURTHER COMPRISES A SECOND THERMOCOUPLE │
│  HAVING A SECOND THERMOCOUPLE JUNCTION DISPOSED │
│  DOWNSTREAM OF THE CENTERLINE │
└─────────────────────────────────────────────────┘
```

FIG. 12

THERMOPILE-BASED FLOW SENSING DEVICE

CROSS-REFERENCE TO RELATED APPLICATIONS

This application is a continuation application of U.S. patent application Ser. No. 16/389,647, filed Apr. 19, 2019, which is hereby incorporated herein by reference in its entirety.

TECHNOLOGICAL FIELD

Example embodiments of the present disclosure relate generally to sensors and, more particularly, to flow sensors.

BACKGROUND

Industrial and commercial applications are increasingly utilizing flow sensors to measure and control the mass flow rates of gases and liquids. However, conventional flow sensor designs often exhibit drift characteristics that decrease their measurement sensitivities.

Applicant has identified a number of deficiencies and problems associated with conventional flow sensors. Through applied effort, ingenuity, and innovation, many of these identified problems have been solved by developing solutions that are included in embodiments of the present disclosure, many examples of which are described in detail herein.

SUMMARY

Systems, apparatuses, methods, and computer program products are disclosed herein for providing for a thermopile-based flow sensing device that exhibits low drift or no drift characteristics that, in some instances, is compatible with complementary metal-oxide-semiconductor (CMOS) processing.

In one example embodiment, an apparatus is provided for sensing a flow of fluid. The apparatus may comprise a flow sensing device comprising a heating structure having a centerline. The flow sensing device may further comprise a thermopile. At least a portion of the thermopile may be disposed over the heating structure. The thermopile may comprise a first thermocouple having a first thermocouple junction disposed upstream of the centerline of the heating structure. The thermopile may further comprise a second thermocouple having a second thermocouple junction disposed downstream of the centerline of the heating structure.

In another example embodiment, a method is provided for manufacturing an apparatus for sensing a flow of fluid. The method may comprise providing a heating structure having a centerline. The method may further comprise disposing at least a portion of a thermopile over the heating structure. The thermopile may comprise a first thermocouple having a first thermocouple junction disposed upstream of the centerline of the heating structure. The thermopile may further comprise a second thermocouple having a second thermocouple junction disposed downstream of the centerline of the heating structure.

In yet another example embodiment, an apparatus for sensing a flow of fluid. The apparatus may comprise a flow sensing device comprising a heating structure having a centerline. The flow sensing device may further comprise a first thermopile comprising a first plurality of thermocouples disposed upstream of the centerline of the heating structure. The first plurality of thermocouples may comprise a first subset of the first plurality of thermocouples aligned substantially parallel to the centerline of the heating structure. The first plurality of thermocouples may further comprise a second subset of the first plurality of thermocouples aligned substantially perpendicular to the centerline of the heating structure. The flow sensing device may further comprise a second thermopile comprising a second plurality of thermocouples disposed downstream of the centerline of the heating structure. The second plurality of thermocouples may comprise a third subset of the second plurality of thermocouples aligned substantially parallel to the centerline of the heating structure. The second plurality of thermocouples may further comprise a fourth subset of the second plurality of thermocouples aligned substantially perpendicular to the centerline of the heating structure.

In yet another example embodiment, a method is provided for manufacturing an apparatus for sensing a flow of fluid. The method may comprise providing a heating structure having a centerline. The method may further comprise disposing a first thermopile upstream of the centerline of the heating structure. The first thermopile may comprise a first plurality of thermocouples disposed upstream of the centerline of the heating structure. The first plurality of thermocouples may comprise a first subset of the first plurality of thermocouples aligned substantially parallel to the centerline of the heating structure. The first plurality of thermocouples may further comprise a second subset of the first plurality of thermocouples aligned substantially perpendicular to the centerline of the heating structure. The method may further comprise disposing a second thermopile downstream of the centerline of the heating structure. The second thermopile may comprise a second plurality of thermocouples disposed downstream of the centerline of the heating structure. The second plurality of thermocouples may comprise a third subset of the second plurality of thermocouples aligned substantially parallel to the centerline of the heating structure. The second plurality of thermocouples may further comprise a fourth subset of the second plurality of thermocouples aligned substantially perpendicular to the centerline of the heating structure.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will be appreciated that the scope of the disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings, which illustrate example embodiments and features of the present disclosure and are not necessarily drawn to scale. It will be understood that the components and structures illustrated in the drawings may or may not be present in various embodiments of the disclosure described herein. Accordingly, some embodiments or features of the present disclosure may include fewer or more components or structures than those shown in the drawings while not departing from the scope of the disclosure.

FIGS. 9A, 9B, 9C, 9D, 9E, 9F, 9G, 9H, 9I, 9J, 9K, 9L, 9M, 9N, 9O, 9P, 9Q, 9R, 9S, and 9T illustrate an example process flow for fabricating an example thermopile-based flow sensing device in accordance with some example embodiments described herein.

FIG. 11 illustrates an example table of thermocouple materials for use in an example thermopile-based flow sensing device in accordance with some example embodiments described herein.

FIG. 12 illustrates an example flowchart illustrating an example method in accordance with some example embodiments described herein.

DETAILED DESCRIPTION

Figure 1:
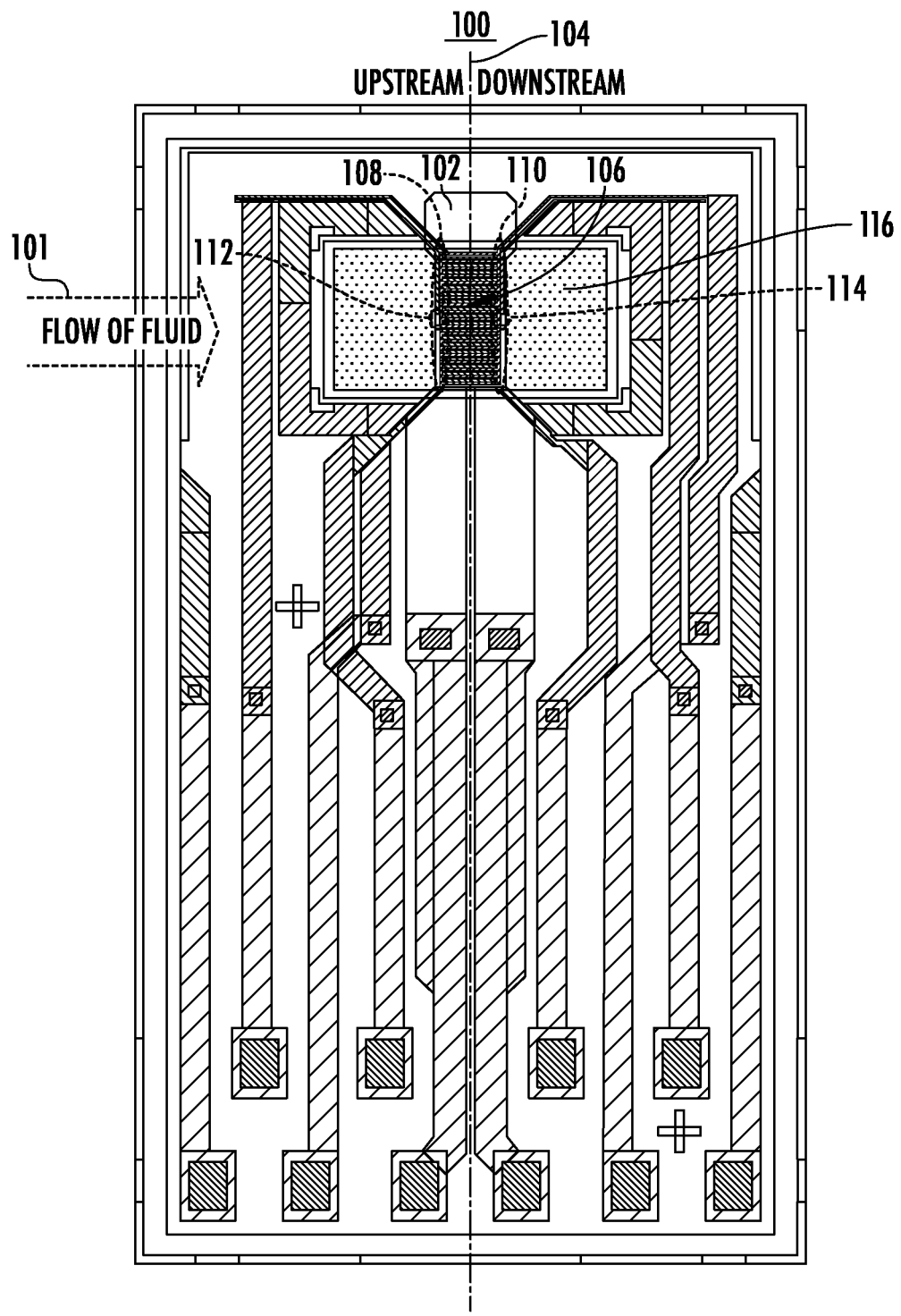
FIG. 1 illustrates an example layout for an example thermopile-based flow sensing device in accordance with some example embodiments described herein.

The following description should be read with reference to the drawings wherein like reference numerals indicate like elements throughout the several views. The detailed description and drawings show several embodiments which are meant to be illustrative of the disclosure. It should be understood that any numbering of disclosed features (e.g., first, second, etc.) and/or directional terms used in conjunction with disclosed features (e.g., front, back, under, above, etc.) are relative terms indicating illustrative relationships between the pertinent features. The word "example," when used herein, is intended to mean "serving as an example, instance, or illustration." Any implementation described herein as an "example" is not necessarily preferred or advantageous over other implementations.

It should be understood at the outset that although illustrative implementations of one or more aspects are illustrated below, the disclosed assemblies, systems, and methods may be implemented using any number of techniques. The disclosure should in no way be limited to the illustrative implementations, drawings, and techniques illustrated below, but may be modified within the scope of the appended claims along with their full scope of equivalents. While values for dimensions of various elements are disclosed, the drawings may not be to scale.

Typically, hot wire anemometer flow sensor die outputs drift while powered. In these hot wire anemometer flow sensors, which typically use platinum as the resistor material, the drift in the sensor is due to stress relaxation in the platinum layer and changes in stress in the silicon nitride layers around the platinum which form the air bridge, in part because platinum has piezo-resistive properties whose resistance changes with stress. In other words, the drift in these hot wire anemometer flow sensors often is due to stress relaxation in the platinum layer and is impacted by the residual stress in the air bridge (also known as the microbridge). For example, drift has been directly correlated to the stress in the plasma enhanced chemical vapor deposition (PECVD) silicon nitride layer on the surface of the microbridge. This stress in the PECVD silicon nitride layer can change over time since the air bridge is constantly heated by a resistive heater, which is an integral part of the flow sensor. Experimentally, this drift has been measured at values up to about 40 uV per day at null flow. Accordingly, there is a need for a flow sensor that can be used with gases and liquids that exhibits low drift characteristics.

Example embodiments described herein provide systems, apparatuses, and methods for reducing or eliminating the drift experienced by conventional flow sensors by providing various arrangements for a thermopile-based flow sensing device. In some embodiments, by using a thermocouple or thermopile, the signal generated by the thermopile-based flow sensing device disclosed herein is a voltage source and is minimally responsive to film resistance. Without film resistance sensitivity, other sensitivities such as stress or magnetic resistance changes are negligible. Additional thermocouples give additional voltage, signal, and sensitivity, whereas a conventional resistive flow sensor does not have this advantage for sensitivity. In some instances, the thermopile structures may be fabricated on either a microbridge structure or a membrane structure. In some embodiments, the membrane structures disclosed herein may provide for the same thermopile structures as a microbridge plus additional structures not possible with a microbridge.

In some embodiments, the general flow for fabricating a thermopile flow sensor is as follows:

1. Grow thermal silicon dioxide.
2. Deposit bottom silicon nitride. In some embodiments, all silicon nitride dielectrics could be replaced with silicon dioxide, such as PECVD, tetraethoxysilane (TEOS), or sputter depositions for lower thermal conductivity.
3. Deposit and pattern resistive heater structure. The heater structure can be fabricated from, among other materials: silicon (including polysilicon); Pt; nichrome; permalloy; PtSi and other silicides; W; TiN; AlN; WN; any other suitable material; or any combination thereof.
4. Deposit silicon nitride interlayer dielectric.
5. Deposit and pattern first thermocouple material. Various thermocouple materials that may be used for the first thermocouple are discussed in greater detail with reference to FIG. 11.
6. Deposit interlayer dielectric. In some instances, this step may be optional depending on the materials used but may lead to higher yield. In some instances, if an interlayer dielectric is used it must be patterned to open vias to the underlying thermocouple material.

7. Deposit and pattern second thermocouple material. Various thermocouple materials that may be used for the second thermocouple are discussed in greater detail with reference to FIG. 11.

8. Deposit interlayer dielectric, pattern, and open vias to heater and thermopile connections.

9. Deposit metal (such as Al/1% Cu) and pattern to form lead-outs and bond pads.

10. Deposit overcoat silicon nitride and pattern to open bond pad regions.

11. Pattern back-side of wafer and use deep reactive ion etching (DRIE) to produce cavity below thermopile structure.

In some embodiments, as discussed with reference to FIGS. 1, 2, 3, 4, 5, 6, 9, 10, and 12, the heater structure may be located below a single set of thermocouples (e.g., one thermopile) with one side located upstream of the heater structure and the other side located downstream of the heater structure. In these arrangements, the thermocouples do not sit on the silicon die. Rather, the thermocouples are suspended over a cavity or reside on a membrane structure. In some embodiments, the set of thermocouples may be collectively referred to as a thermopile. In some embodiments, the thermopile may be placed on a thermally isolated structure, such as a bridge or a membrane, with the opposing thermocouples (e.g., cold junction, hot junction) oriented such that one set of junctions are upstream and the other set of junctions is downstream of the centerline of a heating element.

In some embodiments, as discussed with reference to FIGS. 7, 8, and 13 the heater structure may be located between two sets of thermocouples (e.g., two thermopiles), with one set of thermocouples located upstream of the heater structure and the other set of thermocouples located downstream of the heater structure. In these arrangements, there are parasitics and each set of thermocouples has one side on the bulk silicon die, which can float in temperature.

Figure 6:
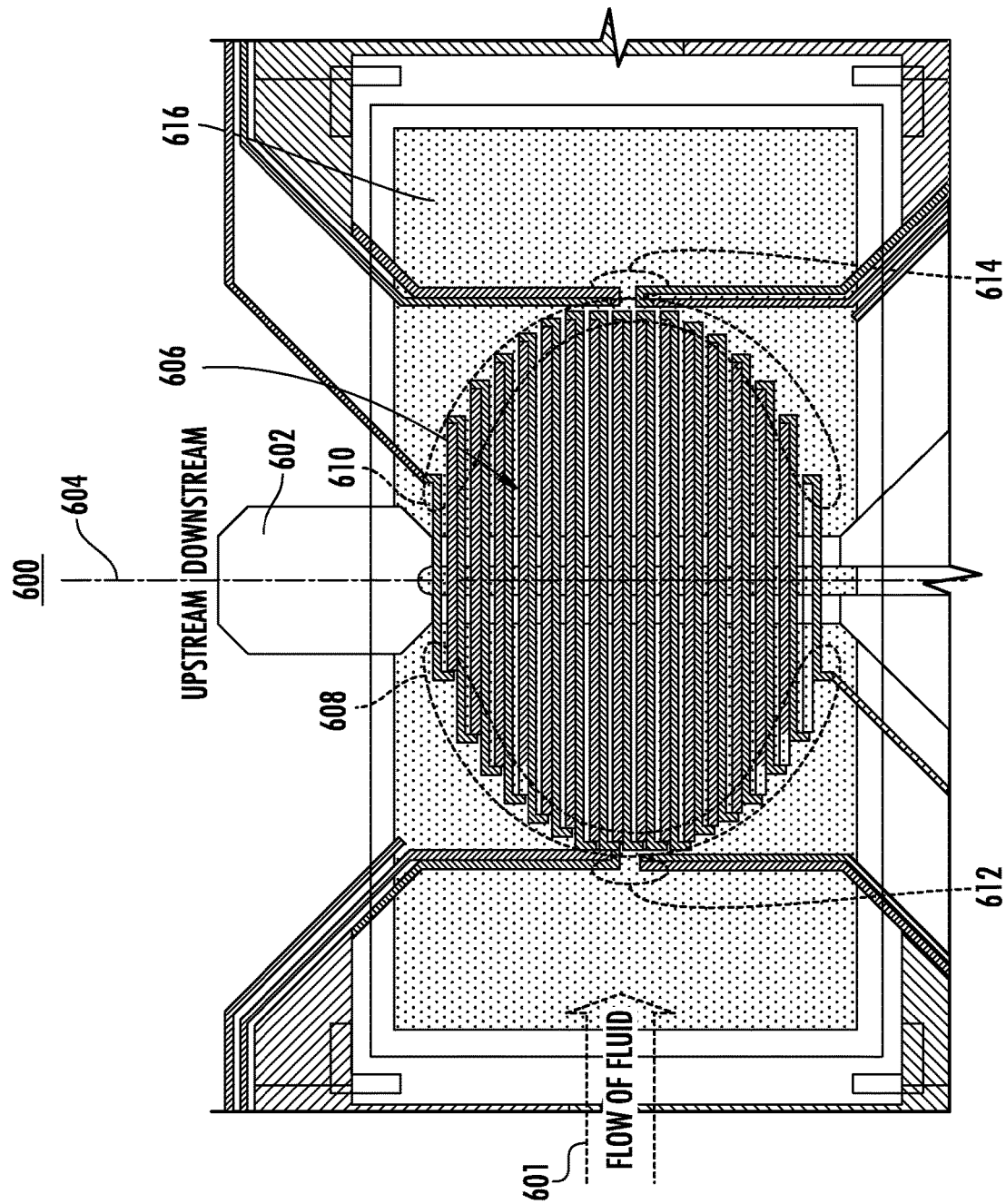
FIG. 6 illustrates another example layout for an example thermopile-based flow sensing device in accordance with some example embodiments described herein.

In some embodiments, the following equation may be used to characterize the thermopile-based flow sensing devices disclosed herein:

$$\Delta V = n \Delta S (\Delta T)$$

where $\Delta V$=potential difference; n=the number of thermocouples; S=Seebeck coefficient (also referred to as thermopower, thermoelectric power (TE), or thermoelectric sensitivity); $\Delta S$=TE1−TE2 (the thermoelectric power of the first thermoelectric material—the thermoelectric power of the second thermoelectric material); T=temperature; and $\Delta T = T_1 - T_{ref}$ (the temperature at the measured thermoelectric junction(s)—the temperature at the reference thermoelectric junction(s)). In some instances, such as is shown in FIG. 7, $T_1$ may be measured on the membrane structure 716 using the downstream thermocouple junctions 712, and may be measured on the bulk silicon using the downstream thermocouple junctions 713. In other instances, such as is shown in FIG. 6, the relative temperature difference $\Delta T$ may be measured on the membrane structure 716 using the upstream thermocouple junctions 608 and the downstream thermocouple junctions 610 without the use of a reference temperature.

There are many advantages of the embodiments disclosed herein, such as: (1) providing low drift or no drift devices (e.g., as discussed with reference to FIGS. 1, 2, 3, 4, 5, 6, 7, 8, 9, 10, 12, and 13); (2) providing potential compatibility with CMOS processing via unique combinations of thermocouple materials (e.g., as discussed with reference to FIG. 11).

Although the disclosure describes the features of the thermopile-based flow sensing device disclosed herein with reference to a flow sensor, the thermopile-based flow sensing device disclosed herein may be used to test in any suitable sensor, detector, gauge, instrument, or application where precision heating or temperature detection is utilized, utilizable, or otherwise desirable.

FIG. 1 illustrates an example layout for an example thermopile-based flow sensing device 100 in accordance with some example embodiments described herein. In some embodiments, the example thermopile-based flow sensing device 100 may be provided for sensing a flow of fluid 101 (e.g., a flow of a gas or liquid). In some embodiments, the example thermopile-based flow sensing device 100 may comprise a heating structure 102 having a centerline 104. In some embodiments, the example thermopile-based flow sensing device 100 may further comprise a thermopile 106. In some embodiments, at least a portion of the thermopile 106 may be disposed over the heating structure 102.

In some embodiments, the thermopile 106 may comprise a plurality of thermocouples having a plurality of thermocouple junctions. In some embodiments, the plurality of thermocouples may have a plurality of upstream thermocouple junctions 108 (e.g., nineteen upstream thermocouple junctions) disposed upstream of the centerline 104 of the heating structure 102. In some embodiments, the plurality of thermocouples may have a plurality of downstream thermocouple junctions 110 (e.g., nineteen downstream thermocouple junctions) disposed downstream of the centerline 104 of the heating structure 102. In some embodiments, the plurality of upstream thermocouple junctions 108 and the plurality of downstream thermocouple junctions 110 may be disposed over the heating structure 102. In some embodiments, the number of upstream thermocouple junctions 108 and the number of downstream thermocouple junctions 110 may be the same. In some embodiments, the number of upstream thermocouple junctions 108 and the number of downstream thermocouple junctions 110 may depend (e.g., may be a function of) the Seebeck coefficients of the thermocouple materials in the thermocouples and the desired output voltage.

In some embodiments, the example thermopile-based flow sensing device 100 may further comprise a plurality of upstream sample temperature sensing thermocouple junctions 112 (e.g., two upstream sample temperature sensing thermocouple junctions) disposed upstream of the centerline 104 of the heating structure 102. In some embodiments, the example thermopile-based flow sensing device 100 may further comprise a plurality of downstream sample temperature sensing thermocouple junctions 114 (e.g., two downstream sample temperature sensing thermocouple junctions) disposed downstream of the centerline 104 of the heating structure 102. In some embodiments, the plurality of upstream sample temperature sensing thermocouple junctions 112 and the plurality of downstream sample temperature sensing thermocouple junctions 114 may be disposed over the heating structure 102.

In some embodiments, each of the plurality of upstream thermocouple junctions 108, the plurality of downstream thermocouple junctions 110, the plurality of upstream sample temperature sensing thermocouple junctions 112, and the plurality of downstream sample temperature sensing thermocouple junctions 114 may comprise a respective interface between a first thermocouple material and a second thermocouple material as described in greater detail with reference to FIG. 11.

In some embodiments, as shown in FIG. 1, the example thermopile-based flow sensing device 100 may comprise a substrate defining a membrane structure 116. In some embodiments, a portion of the heating structure 102 may be disposed over the membrane structure 116. In some embodiments, the thermopile 106, the plurality of thermocouples, the plurality of upstream thermocouple junctions 108, the plurality of downstream thermocouple junctions 110, the plurality of upstream sample temperature sensing thermocouple junctions 112, the plurality of downstream sample temperature sensing thermocouple junctions 114, one or more portions thereof, or a combination thereof may be disposed over the membrane structure 116. In some embodiments, the membrane structure 116 may provide thermal isolation from the bulk (e.g., silicon) die, which may have a high thermal conductivity. In some embodiments, the shape of the membrane structure 116 may be rectangular, square, circular, oval, or any other suitable shape or combination thereof.

In other embodiments (not shown in FIG. 1 for the sake of brevity), the example thermopile-based flow sensing device 100 may comprise a substrate defining a microbridge structure. In some embodiments, a portion of the heating structure 102 may be disposed over the microbridge structure. In some embodiments, the thermopile 106, the plurality of thermocouples, the plurality of upstream thermocouple junctions 108, the plurality of downstream thermocouple junctions 110, the plurality of upstream sample temperature sensing thermocouple junctions 112, the plurality of downstream sample temperature sensing thermocouple junctions 114, one or more portions thereof, or a combination thereof may be disposed over the microbridge structure.

Figure 2A:
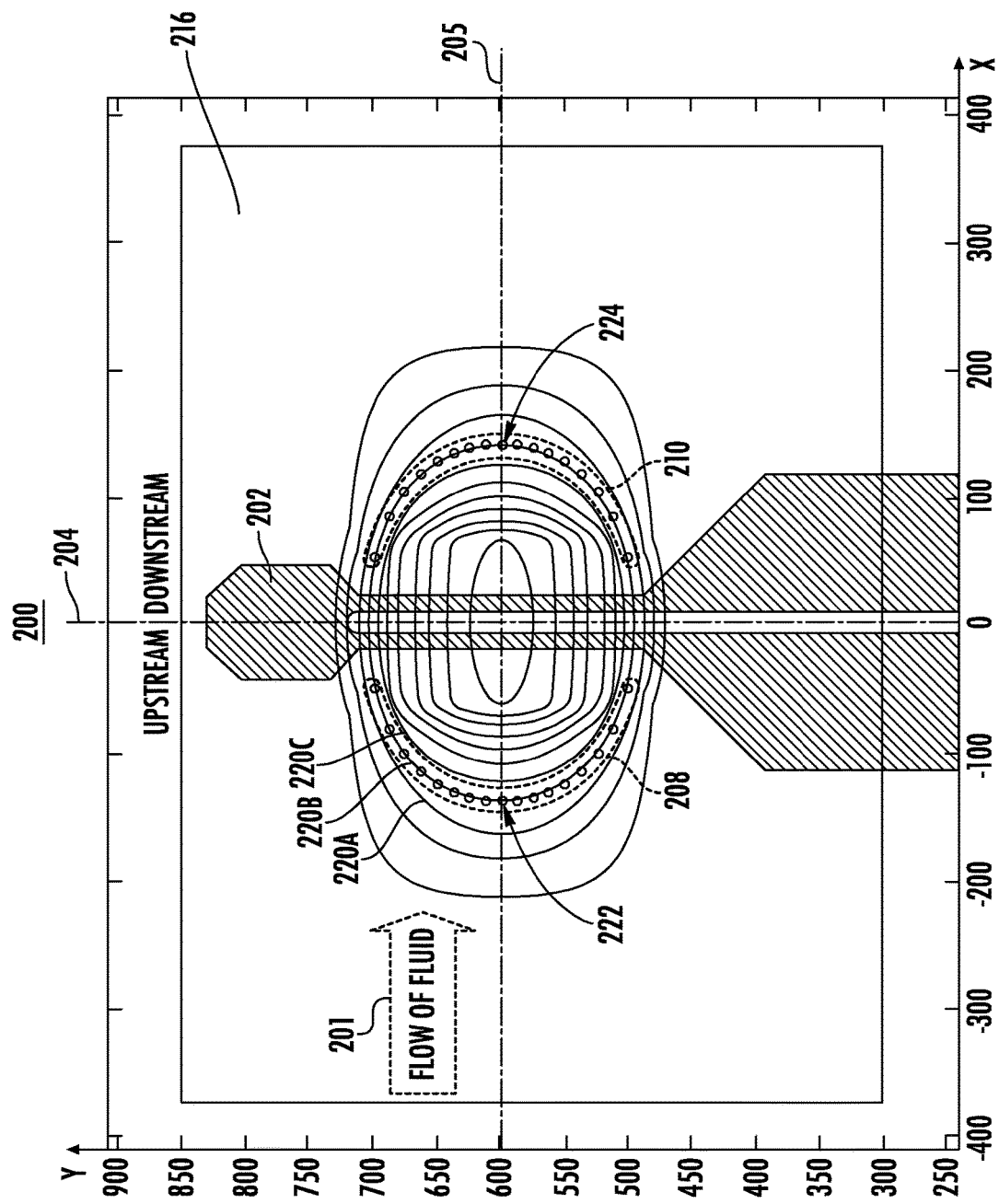
FIGS. 2A and 2B illustrate example temperature isolines for an example thermopile-based flow sensing device in accordance with some example embodiments described herein.

FIG. 2A illustrates example temperature isolines 220 (e.g., including, but not limited to, temperature isoline 220A, maximum temperature difference isoline 220B (the temperature isoline that extends through about the locations where the maximum temperature difference occurs), and temperature isoline 220C) for an example thermopile-based flow sensing device 200 in accordance with some example embodiments described herein.

Figure 2B:
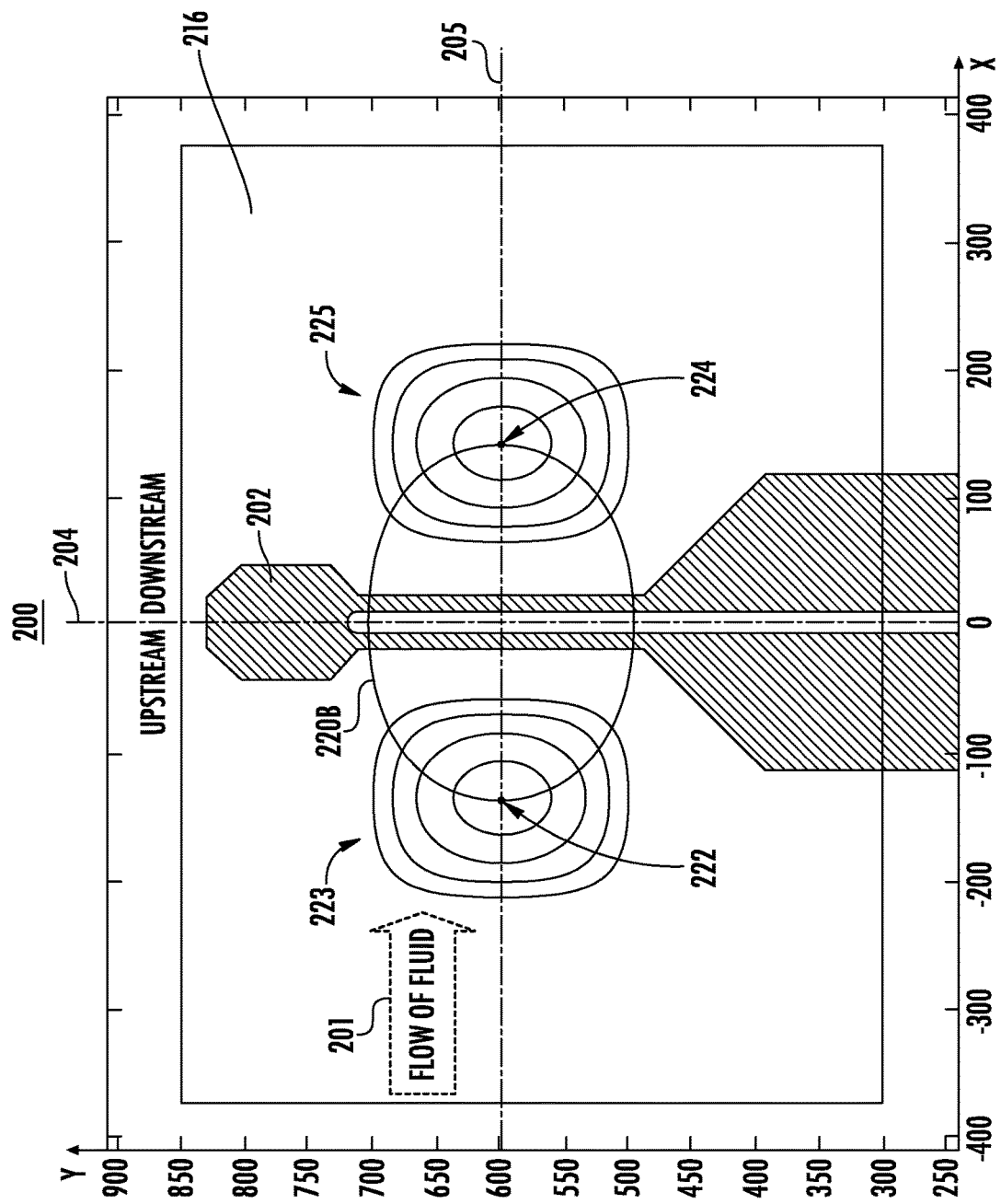

In some embodiments, as shown in FIGS. 2A and 2B, the example thermopile-based flow sensing device 200 may be provided for sensing a flow of fluid 201 (e.g., a flow of a gas or liquid). In some embodiments, the example thermopile-based flow sensing device 200 may comprise a heating structure 202 having a centerline 204 and an axis 205 arranged perpendicular to the centerline 204. In some embodiments, the example thermopile-based flow sensing device 200 may further comprise a thermopile. In some embodiments, at least a portion of the thermopile may be disposed over the heating structure 202.

In some embodiments, as shown in FIGS. 2A and 2B, the thermopile may comprise a plurality of thermocouples having a plurality of thermocouple junctions. In some embodiments, the plurality of thermocouples may have a plurality of upstream thermocouple junctions 208 (e.g., seventeen upstream thermocouple junctions) disposed upstream of the centerline 204 of the heating structure 202. In some embodiments, the plurality of thermocouples may have a plurality of downstream thermocouple junctions 210 (e.g., seventeen downstream thermocouple junctions) disposed downstream of the centerline 204 of the heating structure 202. In some embodiments, the number of upstream thermocouple junctions 208 and the number of downstream thermocouple junctions 210 may be the same. In some embodiments, the number of upstream thermocouple junctions 208 and the number of downstream thermocouple junctions 210 may depend (e.g., may be a function of) the Seebeck coefficients of the thermocouple materials in the thermocouples and the desired output voltage.

In some embodiments, as shown in FIGS. 2A and 2B, each of the plurality of upstream thermocouple junctions 208 and the plurality of downstream thermocouple junctions 210 may occur along a maximum temperature difference isoline 220B (e.g., the temperature isoline that extends through about the minimum temperature difference location 222 and the maximum temperature difference location 224), where the farthest upstream thermocouple junction of the plurality of upstream thermocouple junctions 208 occurs at about a minimum temperature difference location 222, and where the farthest downstream thermocouple junction of the plurality of downstream thermocouple junctions 210 occurs at about a maximum temperature difference location 224, respectively. For example, a maximum temperature difference may be defined by a minimum temperature difference location 222 upstream of the centerline 204 and a maximum temperature difference located at a maximum temperature difference location 224 downstream of the centerline 204. The plurality of upstream thermocouple junctions 208 may be disposed at about a plurality of locations on the maximum temperature difference isoline 220B. In other words, the plurality of upstream thermocouple junctions 208 may be disposed upstream of the centerline 204 at about a first plurality of points on an upstream portion of the maximum temperature difference isoline 220B that extends through the minimum temperature difference location 222. The plurality of downstream thermocouple junctions 210 may be disposed downstream of the centerline 204 at about a second plurality of points on a downstream portion of the maximum temperature difference isoline 220B that extends through the maximum temperature difference location 224. In some embodiments, the plurality of upstream thermocouple junctions 208 and the plurality of downstream thermocouple junctions 210 may not be disposed over the heating structure 202.

FIG. 2B illustrates example minimum temperature isolines 223 disposed around the minimum temperature difference location 222. FIG. 2B further illustrates example maximum temperature isolines 225 disposed around the maximum temperature difference location 224.

In some embodiments, as shown in FIGS. 2A and 2B, the minimum temperature difference location 222 may be located about 135 micrometers upstream of the centerline 204. In some embodiments, as shown in FIGS. 2A and 2B, the maximum temperature difference location 224 may be about 137 micrometers downstream of the centerline 204. The locations of the minimum temperature difference location 222 and the maximum temperature difference location 224 may change with changes in the membrane structure 216 (e.g., shape, thickness), heating structure 202 (e.g., shape, thickness, material(s)), voltage applied to the heating structure 202, and other structures.

In some embodiments, each of the plurality of upstream thermocouple junctions 208 and the plurality of downstream thermocouple junctions 210 may comprise a respective interface between a first thermocouple material and a second thermocouple material as described in greater detail with reference to FIG. 11.

In some embodiments, as shown in FIGS. 2A and 2B, the example thermopile-based flow sensing device 200 may comprise a substrate defining a membrane structure 216. In some embodiments, a portion of the heating structure 202 may be disposed over the membrane structure 216. In some embodiments, the thermopile, the plurality of thermocouples, the plurality of upstream thermocouple junctions 208, the plurality of downstream thermocouple junctions 210, one or more portions thereof, or a combination thereof may be disposed over the membrane structure 216. In some embodiments, the membrane structure 216 may provide thermal isolation from the bulk (e.g., silicon) die, which may have a high thermal conductivity. In some embodiments, the shape of the membrane structure 216 may be rectangular, square, circular, oval, or any other suitable shape or combination thereof.

In other embodiments (not shown in FIG. 2A or FIG. 2B for the sake of brevity), the example thermopile-based flow sensing device 200 may comprise a substrate defining a microbridge structure. In some embodiments, a portion of the heating structure 202 may be disposed over the microbridge structure. In some embodiments, the thermopile, the plurality of thermocouples, the plurality of upstream thermocouple junctions 208, the plurality of downstream thermocouple junctions 210, one or more portions thereof, or a combination thereof may be disposed over the microbridge structure.

Figure 3:
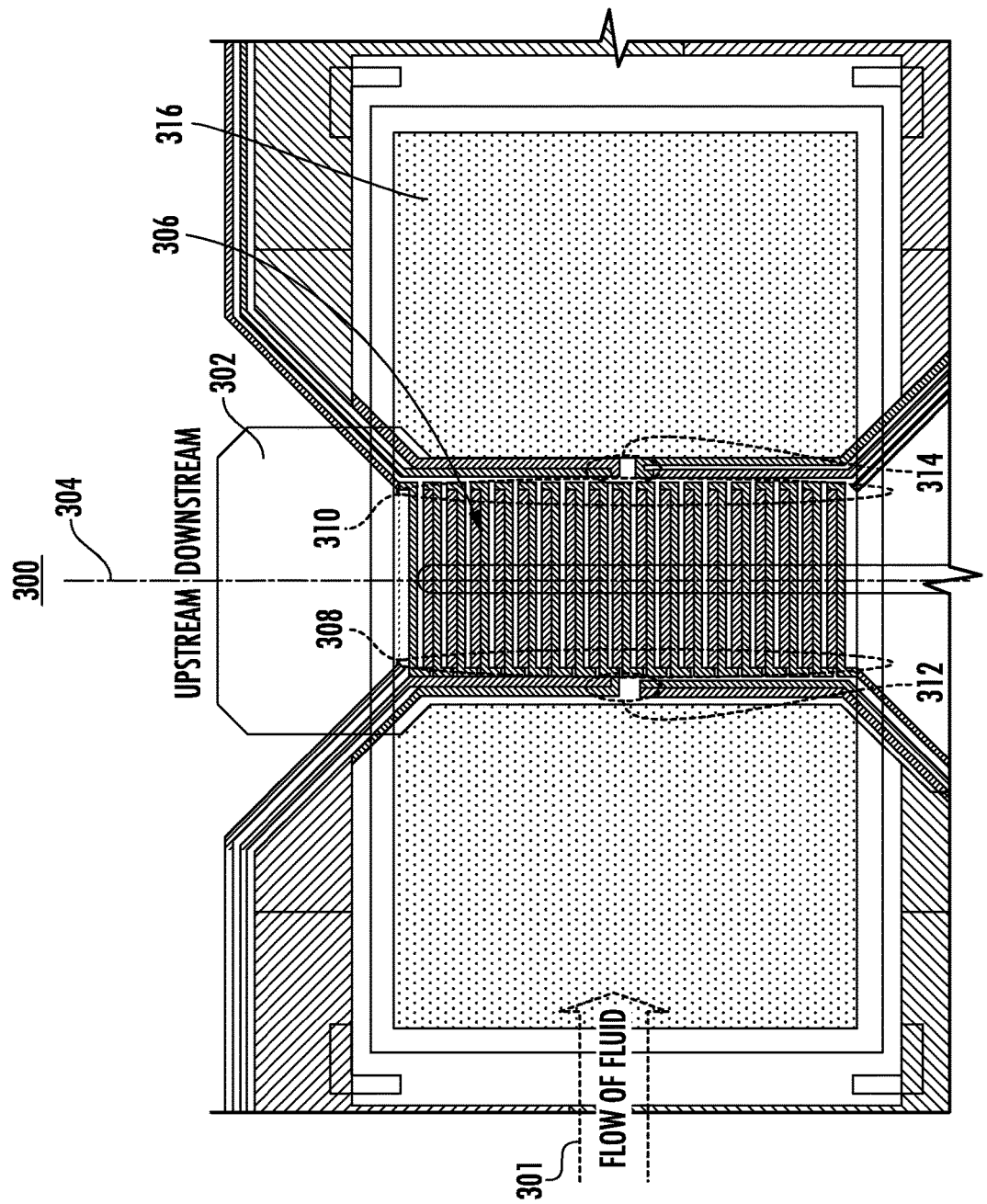
FIG. 3 illustrates another example layout for an example thermopile-based flow sensing device in accordance with some example embodiments described herein.

FIG. 3 illustrates an example layout for an example thermopile-based flow sensing device 300 in accordance with some example embodiments described herein. In some embodiments, the example thermopile-based flow sensing device 300 may be provided for sensing a flow of fluid 301 (e.g., a flow of a gas or liquid). In some embodiments, the example thermopile-based flow sensing device 300 may comprise a heating structure 302 having a centerline 304. In some embodiments, the example thermopile-based flow sensing device 300 may further comprise a thermopile 306. In some embodiments, at least a portion of the thermopile 306 may be disposed over the heating structure 302.

In some embodiments, the thermopile 306 may comprise a plurality of thermocouples having a plurality of thermocouple junctions. In some embodiments, the plurality of thermocouples may have a plurality of upstream thermocouple junctions 308 (e.g., nineteen upstream thermocouple junctions) disposed upstream of the centerline 304 of the heating structure 302. In some embodiments, the plurality of thermocouples may have a plurality of downstream thermocouple junctions 310 (e.g., nineteen downstream thermocouple junctions) disposed downstream of the centerline 304 of the heating structure 302. In some embodiments, the plurality of upstream thermocouple junctions 308 and the plurality of downstream thermocouple junctions 310 may be disposed over the heating structure 302. In some embodiments, the number of upstream thermocouple junctions 308 and the number of downstream thermocouple junctions 310 may be the same. In some embodiments, the number of upstream thermocouple junctions 308 and the number of downstream thermocouple junctions 310 may depend (e.g., may be a function of) the Seebeck coefficients of the thermocouple materials in the thermocouples and the desired output voltage.

In some embodiments, the example thermopile-based flow sensing device 300 may further comprise a plurality of upstream sample temperature sensing thermocouple junctions 312 (e.g., two upstream sample temperature sensing thermocouple junctions) disposed upstream of the centerline 304 of the heating structure 302. In some embodiments, the example thermopile-based flow sensing device 300 may further comprise a plurality of downstream sample temperature sensing thermocouple junctions 314 (e.g., two downstream sample temperature sensing thermocouple junctions) disposed downstream of the centerline 304 of the heating structure 302. In some embodiments, the plurality of upstream sample temperature sensing thermocouple junctions 312 and the plurality of downstream sample temperature sensing thermocouple junctions 314 may be disposed over the heating structure 302.

In some embodiments, each of the plurality of upstream thermocouple junctions 308, the plurality of downstream thermocouple junctions 310, the plurality of upstream sample temperature sensing thermocouple junctions 312, and the plurality of downstream sample temperature sensing thermocouple junctions 314 may comprise a respective interface between a first thermocouple material and a second thermocouple material as described in greater detail with reference to FIG. 11.

In some embodiments, as shown in FIG. 3, the example thermopile-based flow sensing device 300 may comprise a substrate defining a membrane structure 316. In some embodiments, a portion of the heating structure 302 may be disposed over the membrane structure 316. In some embodiments, the thermopile 306, the plurality of thermocouples, the plurality of upstream thermocouple junctions 308, the plurality of downstream thermocouple junctions 310, the plurality of upstream sample temperature sensing thermocouple junctions 312, the plurality of downstream sample temperature sensing thermocouple junctions 314, one or more portions thereof, or a combination thereof may be disposed over the membrane structure 316. In some embodiments, the membrane structure 316 may provide thermal isolation from the bulk (e.g., silicon) die, which may have a high thermal conductivity. In some embodiments, the shape of the membrane structure 316 may be rectangular, square, circular, oval, or any other suitable shape or combination thereof.

In other embodiments (not shown in FIG. 3 for the sake of brevity), the example thermopile-based flow sensing device 300 may comprise a substrate defining a microbridge structure. In some embodiments, a portion of the heating structure 302 may be disposed over the microbridge structure. In some embodiments, the thermopile 306, the plurality of thermocouples, the plurality of upstream thermocouple junctions 308, the plurality of downstream thermocouple junctions 310, the plurality of upstream sample temperature sensing thermocouple junctions 312, the plurality of downstream sample temperature sensing thermocouple junctions 314, one or more portions thereof, or a combination thereof may be disposed over the microbridge structure.

Figure 4:
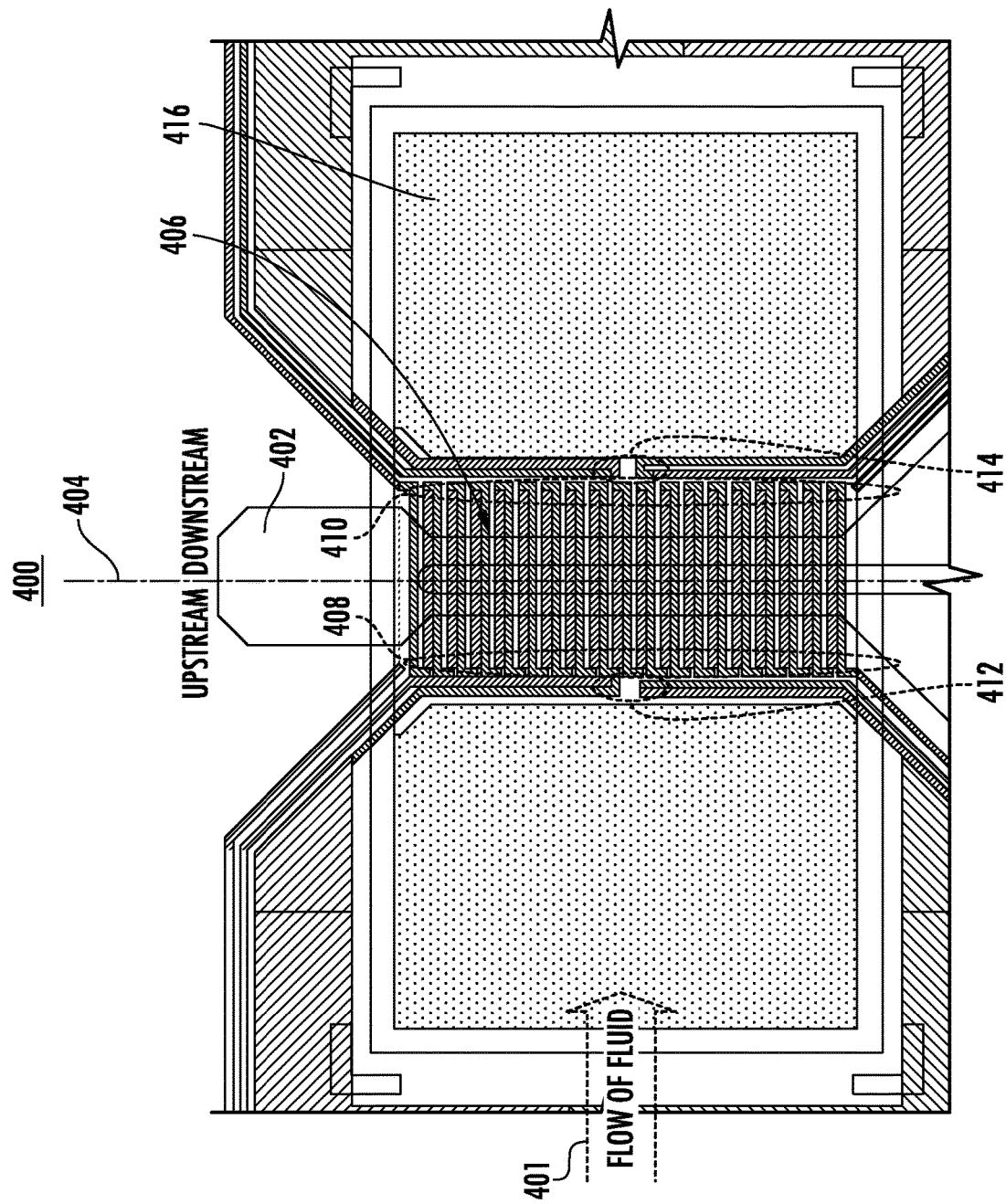
FIG. 4 illustrates another example layout for an example thermopile-based flow sensing device in accordance with some example embodiments described herein.

FIG. 4 illustrates an example layout for an example thermopile-based flow sensing device 400 in accordance with some example embodiments described herein. In some embodiments, the example thermopile-based flow sensing device 400 may be provided for sensing a flow of fluid 401 (e.g., a flow of a gas or liquid). In some embodiments, the example thermopile-based flow sensing device 400 may comprise a heating structure 402 having a centerline 404. In some embodiments, the example thermopile-based flow sensing device 400 may further comprise a thermopile 406. In some embodiments, at least a portion of the thermopile 406 may be disposed over the heating structure 402.

In some embodiments, the thermopile 406 may comprise a plurality of thermocouples having a plurality of thermocouple junctions. In some embodiments, the plurality of thermocouples may have a plurality of upstream thermocouple junctions 408 (e.g., nineteen upstream thermocouple junctions) disposed upstream of the centerline 404 of the heating structure 402. In some embodiments, the plurality of thermocouples may have a plurality of downstream thermocouple junctions 410 (e.g., nineteen downstream thermocouple junctions) disposed downstream of the centerline 404 of the heating structure 402. In some embodiments, the plurality of upstream thermocouple junctions 408 and the plurality of downstream thermocouple junctions 410 may not be disposed over the heating structure 402. In some embodiments, the number of upstream thermocouple junctions 408 and the number of downstream thermocouple junctions 410 may be the same. In some embodiments, the number of upstream thermocouple junctions 408 and the number of downstream thermocouple junctions 410 may depend (e.g., may be a function of) the Seebeck coefficients of the thermocouple materials in the thermocouples and the desired output voltage.

In some embodiments, the example thermopile-based flow sensing device 400 may further comprise a plurality of upstream sample temperature sensing thermocouple junctions 412 (e.g., two upstream sample temperature sensing thermocouple junctions) disposed upstream of the centerline 404 of the heating structure 402. In some embodiments, the example thermopile-based flow sensing device 400 may further comprise a plurality of downstream sample temperature sensing thermocouple junctions 414 (e.g., two downstream sample temperature sensing thermocouple junctions) disposed downstream of the centerline 404 of the heating structure 402. In some embodiments, the plurality of upstream sample temperature sensing thermocouple junctions 412 and the plurality of downstream sample temperature sensing thermocouple junctions 414 may not be disposed over the heating structure 402.

In some embodiments, each of the plurality of upstream thermocouple junctions 408, the plurality of downstream thermocouple junctions 410, the plurality of upstream sample temperature sensing thermocouple junctions 412, and the plurality of downstream sample temperature sensing thermocouple junctions 414 may comprise a respective interface between a first thermocouple material and a second thermocouple material as described in greater detail with reference to FIG. 11.

In some embodiments, as shown in FIG. 4, the example thermopile-based flow sensing device 400 may comprise a substrate defining a membrane structure 416. In some embodiments, a portion of the heating structure 402 may be disposed over the membrane structure 416. In some embodiments, the thermopile 406, the plurality of thermocouples, the plurality of upstream thermocouple junctions 408, the plurality of downstream thermocouple junctions 410, the plurality of upstream sample temperature sensing thermocouple junctions 412, the plurality of downstream sample temperature sensing thermocouple junctions 414, one or more portions thereof, or a combination thereof may be disposed over the membrane structure 416. In some embodiments, the membrane structure 416 may provide thermal isolation from the bulk (e.g., silicon) die, which may have a high thermal conductivity. In some embodiments, the shape of the membrane structure 416 may be rectangular, square, circular, oval, or any other suitable shape or combination thereof.

In other embodiments (not shown in FIG. 4 for the sake of brevity), the example thermopile-based flow sensing device 400 may comprise a substrate defining a microbridge structure. In some embodiments, a portion of the heating structure 402 may be disposed over the microbridge structure. In some embodiments, the thermopile 406, the plurality of thermocouples, the plurality of upstream thermocouple junctions 408, the plurality of downstream thermocouple junctions 410, the plurality of upstream sample temperature sensing thermocouple junctions 412, the plurality of downstream sample temperature sensing thermocouple junctions 414, one or more portions thereof, or a combination thereof may be disposed over the microbridge structure.

Figure 5:
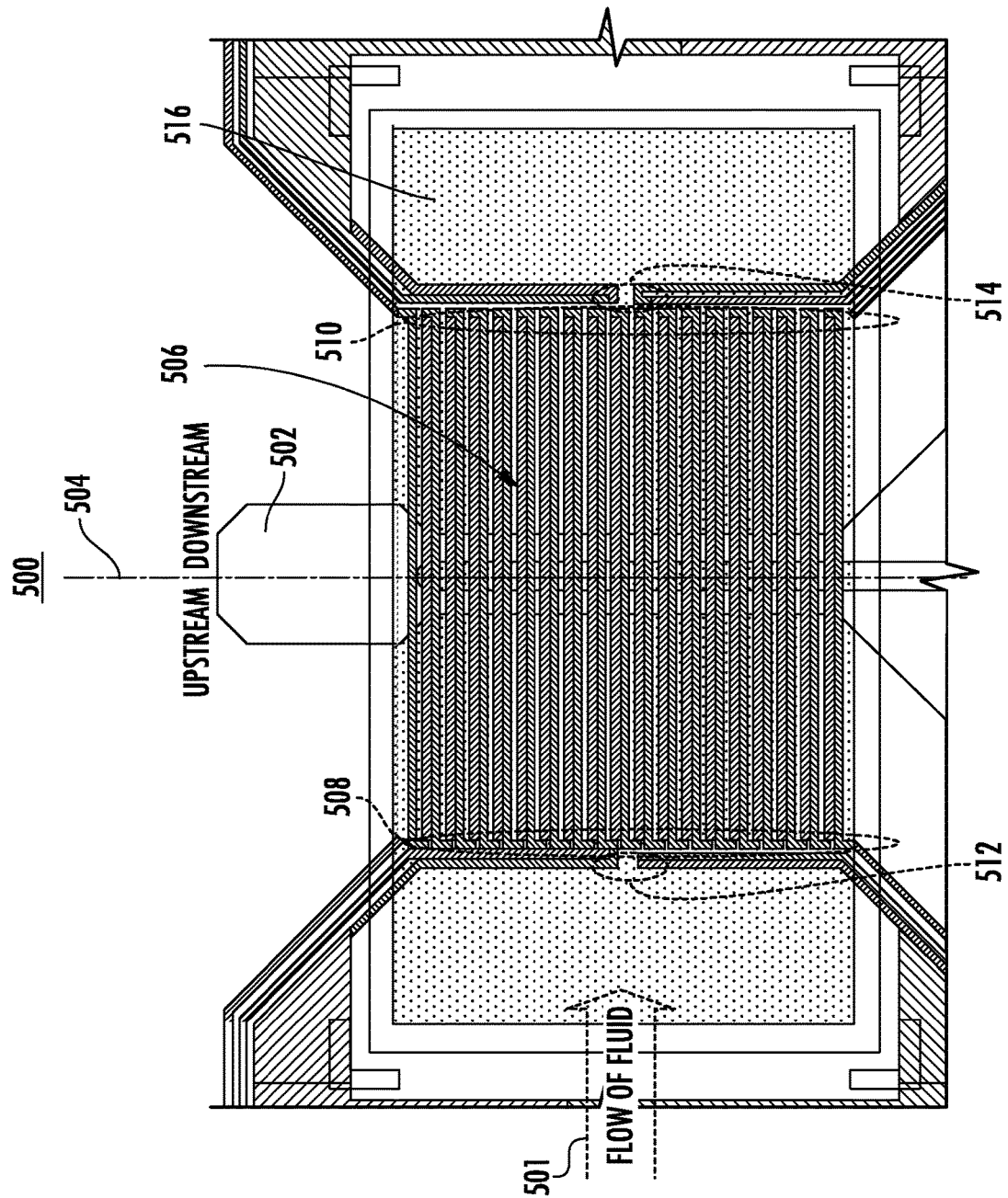
FIG. 5 illustrates another example layout for an example thermopile-based flow sensing device in accordance with some example embodiments described herein.

FIG. 5 illustrates an example layout for an example thermopile-based flow sensing device 500 in accordance with some example embodiments described herein. In some embodiments, the example thermopile-based flow sensing device 500 may be provided for sensing a flow of fluid 501 (e.g., a flow of a gas or liquid). In some embodiments, the example thermopile-based flow sensing device 500 may comprise a heating structure 502 having a centerline 504. In some embodiments, the example thermopile-based flow sensing device 500 may further comprise a thermopile 506. In some embodiments, at least a portion of the thermopile 506 may be disposed over the heating structure 502.

In some embodiments, the thermopile 506 may comprise a plurality of thermocouples having a plurality of thermocouple junctions. In some embodiments, the plurality of thermocouples may have a plurality of upstream thermocouple junctions 508 (e.g., nineteen upstream thermocouple junctions) disposed upstream of the centerline 504 of the heating structure 502. In some embodiments, the plurality of thermocouples may have a plurality of downstream thermocouple junctions 510 (e.g., nineteen downstream thermocouple junctions) disposed downstream of the centerline 504 of the heating structure 502. In some embodiments, the number of upstream thermocouple junctions 508 and the number of downstream thermocouple junctions 510 may be the same. In some embodiments, the number of upstream thermocouple junctions 508 and the number of downstream thermocouple junctions 510 may depend (e.g., may be a function of) the Seebeck coefficients of the thermocouple materials in the thermocouples and the desired output voltage.

In some embodiments, each of the plurality of upstream thermocouple junctions 508 and the plurality of downstream thermocouple junctions 510 may be aligned parallel to centerline 504 and occur along an upstream vertical line through about a minimum temperature difference location (e.g., minimum temperature difference location 222 shown in FIGS. 2A and 2B) and a downstream vertical line through about a maximum temperature difference location (e.g., maximum temperature difference location 224 shown in FIGS. 2A and 2B), respectively. For example, a maximum temperature difference may be defined by a minimum temperature difference located at a first location (e.g., minimum temperature difference location 222 shown in FIGS. 2A and 2B) upstream of the centerline 504 and a maximum temperature difference located at a second location (e.g., maximum temperature difference location 224 shown in FIGS. 2A and 2B) downstream of the centerline 504; the plurality of upstream thermocouple junctions 508 may be disposed upstream of the centerline 504 at about a first plurality of points on a first line that extends through about the first location and is aligned substantially parallel to the centerline 504; and the plurality of downstream thermocouple junctions 510 may be disposed downstream of the centerline 504 at about a second plurality of points on a second line that extends through about the second location and is aligned substantially parallel to the centerline 504. In some embodiments, the plurality of upstream thermocouple junctions 508 and the plurality of downstream thermocouple junctions 510 may not be disposed over the heating structure 502.

In some embodiments, the example thermopile-based flow sensing device 500 may further comprise a plurality of upstream sample temperature sensing thermocouple junctions 512 (e.g., two upstream sample temperature sensing thermocouple junctions) disposed upstream of the centerline 504 of the heating structure 502. In some embodiments, the example thermopile-based flow sensing device 500 may further comprise a plurality of downstream sample temperature sensing thermocouple junctions 514 (e.g., two downstream sample temperature sensing thermocouple junctions) disposed downstream of the centerline 504 of the heating structure 502. In some embodiments, the plurality of upstream sample temperature sensing thermocouple junctions 512 and the plurality of downstream sample temperature sensing thermocouple junctions 514 may not be disposed over the heating structure 502.

In some embodiments, each of the plurality of upstream thermocouple junctions 508, the plurality of downstream thermocouple junctions 510, the plurality of upstream sample temperature sensing thermocouple junctions 512, and the plurality of downstream sample temperature sensing thermocouple junctions 514 may comprise a respective interface between a first thermocouple material and a second thermocouple material as described in greater detail with reference to FIG. 11.

In some embodiments, as shown in FIG. 5, the example thermopile-based flow sensing device 500 may comprise a substrate defining a membrane structure 516. In some embodiments, a portion of the heating structure 502 may be disposed over the membrane structure 516. In some embodiments, the thermopile 506, the plurality of thermocouples, the plurality of upstream thermocouple junctions 508, the plurality of downstream thermocouple junctions 510, the plurality of upstream sample temperature sensing thermocouple junctions 512, the plurality of downstream sample temperature sensing thermocouple junctions 514, one or more portions thereof, or a combination thereof may be disposed over the membrane structure 516. In some embodiments, the membrane structure 516 may provide thermal isolation from the bulk (e.g., silicon) die, which may have a high thermal conductivity. In some embodiments, the shape of the membrane structure 516 may be rectangular, square, circular, oval, or any other suitable shape or combination thereof.

In other embodiments (not shown in FIG. 5 for the sake of brevity), the example thermopile-based flow sensing device 500 may comprise a substrate defining a microbridge structure. In some embodiments, a portion of the heating structure 502 may be disposed over the microbridge structure. In some embodiments, the thermopile 506, the plurality of thermocouples, the plurality of upstream thermocouple junctions 508, the plurality of downstream thermocouple junctions 510, the plurality of upstream sample temperature sensing thermocouple junctions 512, the plurality of downstream sample temperature sensing thermocouple junctions 514, one or more portions thereof, or a combination thereof may be disposed over the microbridge structure.

FIG. 6 illustrates an example layout for an example thermopile-based flow sensing device 600 in accordance with some example embodiments described herein. In some embodiments, the example thermopile-based flow sensing device 600 may be provided for sensing a flow of fluid 601 (e.g., a flow of a gas or liquid). In some embodiments, the example thermopile-based flow sensing device 600 may comprise a heating structure 602 having a centerline 604. In some embodiments, the example thermopile-based flow sensing device 600 may further comprise a thermopile 606. In some embodiments, at least a portion of the thermopile 606 may be disposed over the heating structure 602.

In some embodiments, the thermopile 606 may comprise a plurality of thermocouples having a plurality of thermocouple junctions. In some embodiments, the plurality of thermocouples may have a plurality of upstream thermocouple junctions 608 (e.g., nineteen upstream thermocouple junctions) disposed upstream of the centerline 604 of the heating structure 602. In some embodiments, the plurality of thermocouples may have a plurality of downstream thermocouple junctions 610 (e.g., nineteen downstream thermocouple junctions) disposed downstream of the centerline 604 of the heating structure 602. In some embodiments, the number of upstream thermocouple junctions 608 and the number of downstream thermocouple junctions 610 may be the same. In some embodiments, the number of upstream thermocouple junctions 608 and the number of downstream thermocouple junctions 610 may depend (e.g., may be a function of) the Seebeck coefficients of the thermocouple materials in the thermocouples and the desired output voltage.

In some embodiments, each of the plurality of upstream thermocouple junctions 608 and the plurality of downstream thermocouple junctions 610 may occur along a maximum temperature difference isoline (e.g., maximum temperature difference isoline 220B shown in FIGS. 2A and 2B), where the farthest upstream thermocouple junction of the plurality of upstream thermocouple junctions 608 occurs at about a minimum temperature difference location (e.g., minimum temperature difference location 222 shown in FIGS. 2A and 2B), and where the farthest downstream thermocouple junction of the plurality of downstream thermocouple junctions 610 occurs at about a maximum temperature difference location (e.g., maximum temperature difference location 224 shown in FIGS. 2A and 2B), respectively. For example, a maximum temperature difference may be defined by a minimum temperature difference located at a first location (e.g., minimum temperature difference location 222 shown in FIGS. 2A and 2B) upstream of the centerline 604 and a maximum temperature difference located at a second location (e.g., maximum temperature difference location 224 shown in FIGS. 2A and 2B) downstream of the centerline 604; and the plurality of upstream thermocouple junctions 608 may be disposed at about a plurality of locations on a maximum temperature difference isoline (e.g., maximum temperature difference isoline 220B shown in FIGS. 2A and 2B). In other words, the plurality of upstream thermocouple junctions 608 may be disposed upstream of the centerline 604 at about a first plurality of points on a first portion (e.g., an upstream portion) of a maximum temperature difference isoline that extends through the first location; and the plurality of downstream thermocouple junctions 610 may be disposed downstream of the centerline 604 at about a second plurality of points on a second portion (e.g., a downstream portion) of the maximum temperature difference isoline that extends through the second location. In some embodiments, the plurality of upstream thermocouple junctions 608 and the plurality of downstream thermocouple junctions 610 may not be disposed over the heating structure 602.

In some embodiments, the example thermopile-based flow sensing device 600 may further comprise a plurality of upstream sample temperature sensing thermocouple junctions 612 (e.g., two upstream sample temperature sensing thermocouple junctions) disposed upstream of the centerline 604 of the heating structure 602. In some embodiments, the example thermopile-based flow sensing device 600 may further comprise a plurality of downstream sample temperature sensing thermocouple junctions 614 (e.g., two downstream sample temperature sensing thermocouple junctions) disposed downstream of the centerline 604 of the heating structure 602. In some embodiments, the plurality of upstream sample temperature sensing thermocouple junctions 612 and the plurality of downstream sample temperature sensing thermocouple junctions 614 may not be disposed over the heating structure 602.

In some embodiments, each of the plurality of upstream thermocouple junctions 608, the plurality of downstream thermocouple junctions 610, the plurality of upstream sample temperature sensing thermocouple junctions 612, and the plurality of downstream sample temperature sensing thermocouple junctions 614 may comprise a respective interface between a first thermocouple material and a second thermocouple material as described in greater detail with reference to FIG. 11.

In some embodiments, as shown in FIG. 6, the example thermopile-based flow sensing device 600 may comprise a substrate defining a membrane structure 616. In some embodiments, a portion of the heating structure 602 may be disposed over the membrane structure 616. In some embodiments, the thermopile 606, the plurality of thermocouples, the plurality of upstream thermocouple junctions 608, the plurality of downstream thermocouple junctions 610, the plurality of upstream sample temperature sensing thermocouple junctions 612, the plurality of downstream sample temperature sensing thermocouple junctions 614, one or more portions thereof, or a combination thereof may be disposed over the membrane structure 616. In some embodiments, the membrane structure 616 may provide thermal isolation from the bulk (e.g., silicon) die, which may have a high thermal conductivity. In some embodiments, the shape of the membrane structure 616 may be rectangular, square, circular, oval, or any other suitable shape or combination thereof.

In other embodiments (not shown in FIG. 6 for the sake of brevity), the example thermopile-based flow sensing device 600 may comprise a substrate defining a microbridge structure. In some embodiments, a portion of the heating structure 602 may be disposed over the microbridge structure. In some embodiments, the thermopile 606, the plurality of thermocouples, the plurality of upstream thermocouple junctions 608, the plurality of downstream thermocouple junctions 610, the plurality of upstream sample temperature sensing thermocouple junctions 612, the plurality of downstream sample temperature sensing thermocouple junctions 614, one or more portions thereof, or a combination thereof may be disposed over the microbridge structure.

Figure 7:
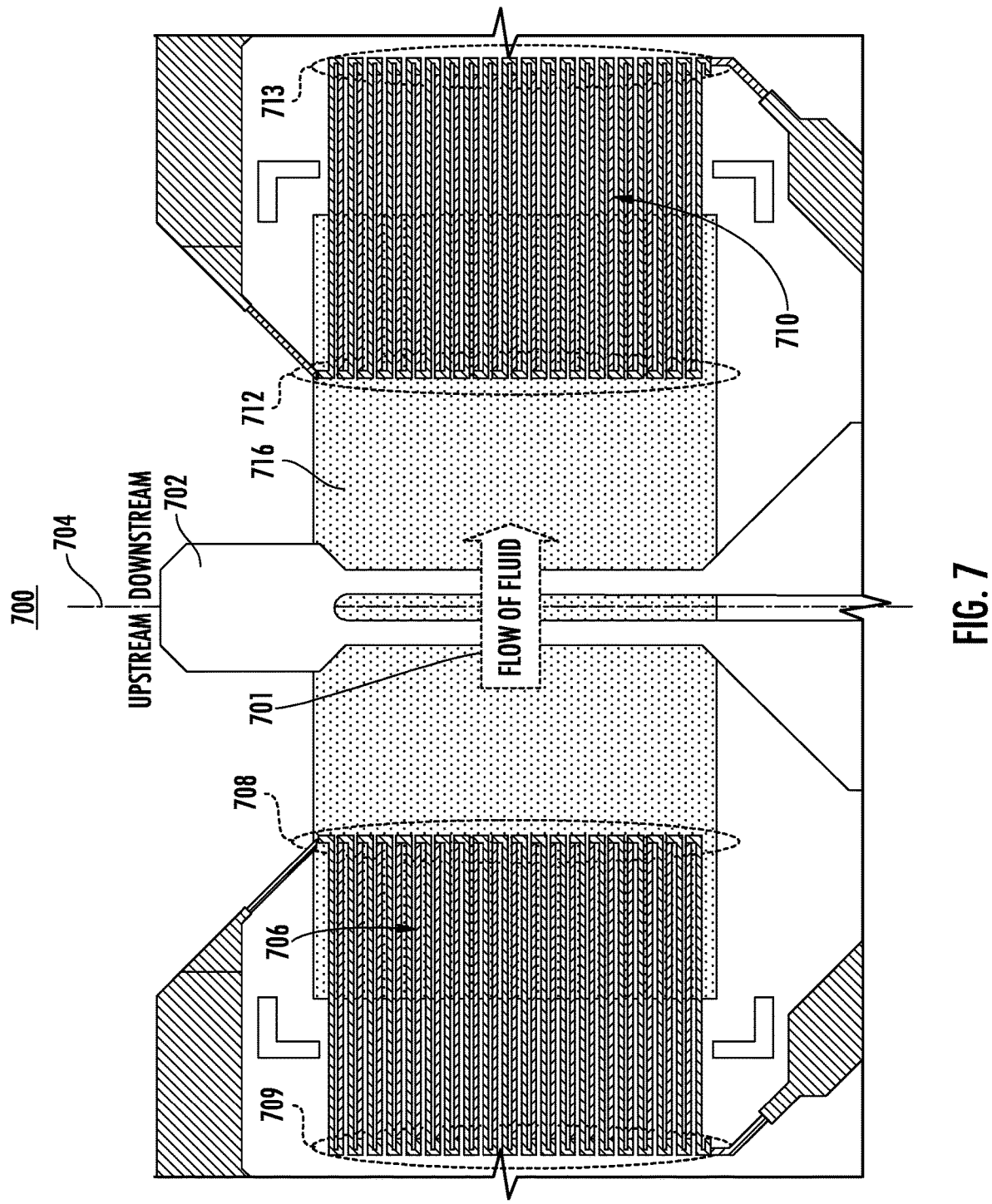
FIG. 7 illustrates another example layout for an example thermopile-based flow sensing device in accordance with some example embodiments described herein.

FIG. 7 illustrates an example layout for an example thermopile-based flow sensing device 700 in accordance with some example embodiments described herein. In some embodiments, the example thermopile-based flow sensing device 700 may be provided for sensing a flow of fluid 701 (e.g., a flow of a gas or liquid). In some embodiments, the example thermopile-based flow sensing device 700 may comprise a heating structure 702 having a centerline 704. In some embodiments, the example thermopile-based flow sensing device 700 may further comprise a first thermopile 706 and a second thermopile 710.

In some embodiments, the first thermopile 706 may comprise a plurality of upstream thermocouples having a first plurality of upstream thermocouple junctions 708 (e.g., nineteen upstream thermocouple junctions) disposed upstream of the centerline 704 of the heating structure 702 and a second plurality of upstream thermocouple junctions 709 (e.g., nineteen upstream thermocouple junctions) disposed further upstream of the centerline 704 of the heating structure 702. In some embodiments, the number of the first plurality of upstream thermocouple junctions 708 and the number of the second plurality of upstream thermocouple junctions 709 may be the same. In some embodiments, the number of the first plurality of upstream thermocouple junctions 708 and the number of the second plurality of upstream thermocouple junctions 709 may depend (e.g., may be a function of) the Seebeck coefficients of the thermocouple materials in the thermocouples and the desired output voltage.

In some embodiments, the first plurality of upstream thermocouple junctions 708 and the second plurality of upstream thermocouple junctions 709 may not be disposed over the heating structure 702. For example, a maximum temperature difference may be defined by a minimum temperature difference located at a first location (e.g., minimum temperature difference location 222 shown in FIGS. 2A and 2B) upstream of the centerline 704 and a maximum temperature difference located at a second location (e.g., maximum temperature difference location 224 shown in FIGS. 2A and 2B) downstream of the centerline 704; the first plurality of upstream thermocouple junctions 708 may be disposed upstream of the centerline 704 at about a first plurality of points on a first line that extends through about the first location and is aligned substantially parallel to the centerline 704; and the second plurality of upstream thermocouple junctions 709 may be disposed further upstream of the centerline 704 at about a second plurality of points on a second line that is aligned substantially parallel to the centerline 704.

In some embodiments, the second thermopile 710 may comprise a plurality of downstream thermocouples having a first plurality of downstream thermocouple junctions 712 (e.g., nineteen downstream thermocouple junctions) disposed downstream of the centerline 704 of the heating structure 702 and a second plurality of downstream thermocouple junctions 713 (e.g., nineteen downstream thermocouple junctions) disposed further downstream of the centerline 704 of the heating structure 702. In some embodiments, the number of the first plurality of downstream thermocouple junctions 712 and the number of the second plurality of downstream thermocouple junctions 713 may be the same. In some embodiments, the number of the first plurality of downstream thermocouple junctions 712 and the number of the second plurality of downstream thermocouple junctions 713 may depend (e.g., may be a function of) the Seebeck coefficients of the thermocouple materials in the thermocouples and the desired output voltage.

In some embodiments, each of the first plurality of upstream thermocouple junctions 708 and the first plurality of downstream thermocouple junctions 712 may be aligned parallel to centerline 704 and occur along an upstream vertical line through about a minimum temperature difference location (e.g., minimum temperature difference location 222 shown in FIGS. 2A and 2B) and a downstream vertical line through about a maximum temperature difference location (e.g., maximum temperature difference location 224 shown in FIGS. 2A and 2B), respectively. For example, a maximum temperature difference may be defined by a minimum temperature difference located at a first location (e.g., minimum temperature difference location 222 shown in FIGS. 2A and 2B) upstream of the centerline 704 and a maximum temperature difference located at a second location (e.g., maximum temperature difference location 224 shown in FIGS. 2A and 2B) downstream of the centerline 704; the first plurality of downstream thermocouple junctions 712 may be disposed downstream of the centerline 704 at about a third plurality of points on a third line that extends through about the second location and is aligned substantially parallel to the centerline 704; and the second plurality of downstream thermocouple junctions may be disposed further downstream of the centerline 704 at about a fourth plurality of points on a fourth line that is aligned substantially parallel to the centerline 704. In some embodiments, the first plurality of downstream thermocouple junctions 712 and the second plurality of downstream thermocouple junctions may not be disposed over the heating structure 702.

In some embodiments, each of the first plurality of upstream thermocouple junctions 708, the second plurality of upstream thermocouple junctions 709, the first plurality of downstream thermocouple junctions 712, the second plurality of downstream thermocouple junctions 713, the plurality of upstream sample temperature sensing thermocouple junctions, and the plurality of downstream sample temperature sensing thermocouple junctions may comprise a respective interface between a first thermocouple material and a second thermocouple material as described in greater detail with reference to FIG. 11.

In some embodiments, as shown in FIG. 7, the example thermopile-based flow sensing device 700 may comprise a substrate defining a membrane structure 716. In some embodiments, a portion of the heating structure 702 may be disposed over the membrane structure 716. In some embodiments, the first thermopile 706, the plurality of upstream thermocouples, the first plurality of upstream thermocouple junctions 708, the second plurality of upstream thermocouple junctions 709, the second thermopile 710, the plurality of downstream thermocouples, the first plurality of downstream thermocouple junctions 712, the second plurality of downstream thermocouple junctions 713, the plurality of upstream sample temperature sensing thermocouple junctions, the plurality of downstream sample temperature sensing thermocouple junctions, one or more portions thereof, or a combination thereof may be disposed over the membrane structure 716. For example, as shown in FIG. 7, a portion of the first thermopile 706 may be disposed over the membrane structure 716 such that the first plurality of upstream thermocouple junctions 708 may be disposed over the membrane structure 716 and the second plurality of upstream thermocouple junctions 709 may not be disposed over the membrane structure 716. In another example, as shown in FIG. 7, a portion of the second thermopile 710 may be disposed over the membrane structure 716 such that the first plurality of downstream thermocouple junctions 712 may be disposed over the membrane structure 716 and the second plurality of downstream thermocouple junctions 713 may not be disposed over the membrane structure 716. In some embodiments, the membrane structure 716 may provide thermal isolation from the bulk (e.g., silicon) die, which may have a high thermal conductivity. In some embodiments, the shape of the membrane structure 716 may be rectangular, square, circular, oval, or any other suitable shape or combination thereof.

Figure 8:
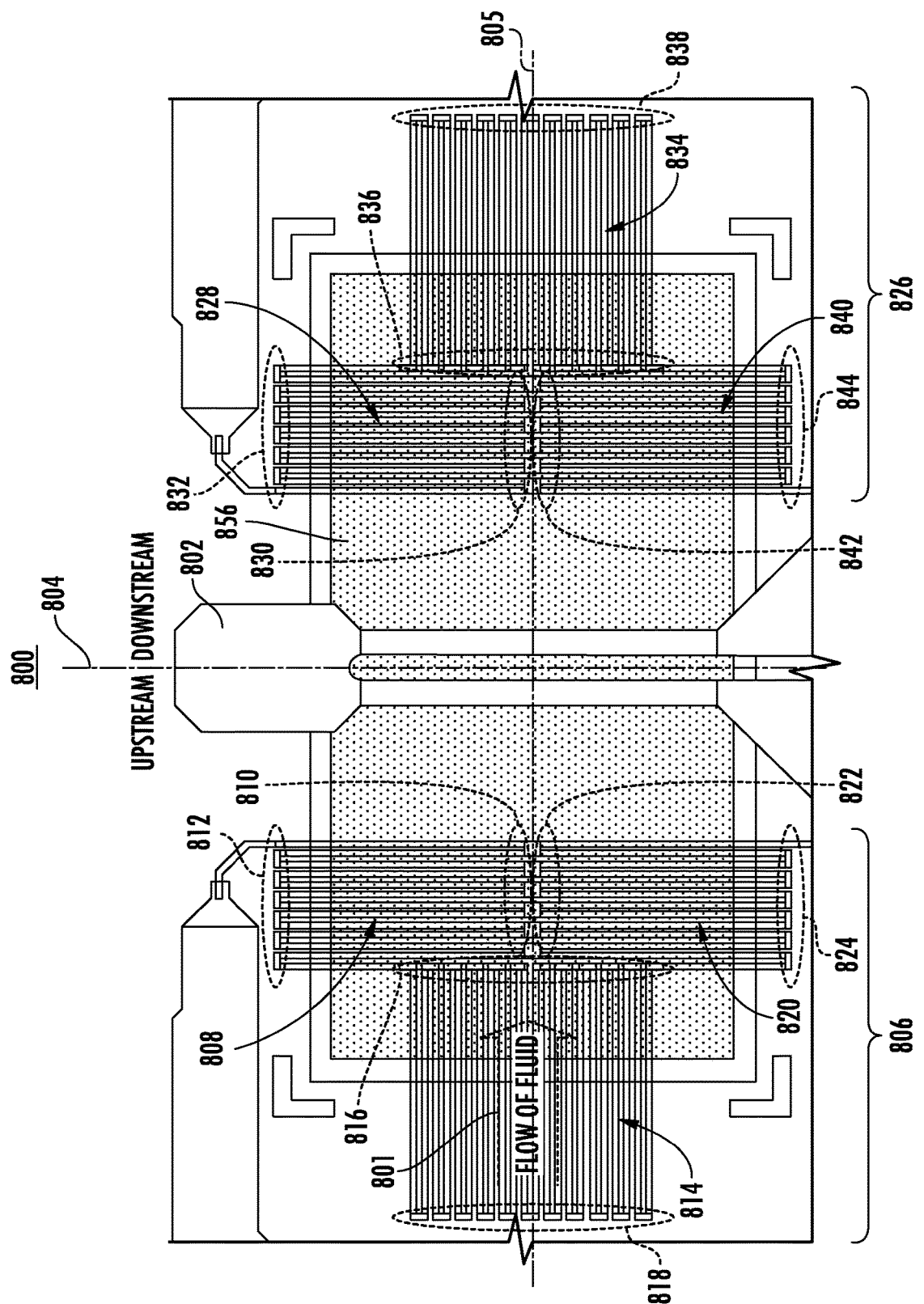
FIG. 8 illustrates another example layout for an example thermopile-based flow sensing device in accordance with some example embodiments described herein.

FIG. 8 illustrates an example layout for an example thermopile-based flow sensing device 800 in accordance with some example embodiments described herein. In some embodiments, the example thermopile-based flow sensing device 800 may be provided for sensing a flow of fluid 801 (e.g., a flow of a gas or liquid). In some embodiments, the example thermopile-based flow sensing device 800 may comprise a heating structure 802 having a centerline 804 and an axis 805 arranged perpendicular to the centerline 804. In some embodiments, the example thermopile-based flow sensing device 800 may further comprise a first thermopile 806 and a second thermopile 826.

In some embodiments, the first thermopile 806 may comprise a plurality of upstream thermocouples disposed upstream of the centerline 804 of the heating structure 802. In some embodiments, the plurality of upstream thermocouples may comprise a first subset of the plurality of upstream thermocouples aligned substantially parallel to the centerline 804 of the heating structure 802, such as a first plurality of upstream parallel thermocouples 808 having a first plurality of upstream thermocouple junctions 810 (e.g., six thermocouple junctions) and a second plurality of upstream thermocouple junctions 812 (e.g., seven thermocouple junctions). In some embodiments, the plurality of upstream thermocouples may further comprise a second subset of the plurality of upstream thermocouples aligned substantially perpendicular to the centerline 804 of the heating structure 802, such as a plurality of upstream perpendicular thermocouples 814 having a third plurality of upstream thermocouple junctions 816 (e.g., eleven thermocouple junctions) and a fourth plurality of upstream thermocouple junctions 818 (e.g., twelve thermocouple junctions). In some embodiments, the plurality of upstream thermocouples may comprise a third subset of the plurality of upstream thermocouples aligned substantially parallel to the centerline 804 of the heating structure 802, such as a second plurality of upstream parallel thermocouples 820 having a fifth plurality of upstream thermocouple junctions 822 (e.g., six thermocouple junctions) and a sixth plurality of upstream thermocouple junctions 824 (e.g., six thermocouple junctions). In some embodiments, the first thermopile 806 may not be disposed over the heating structure 802. In some embodiments, the number of the first plurality of upstream thermocouple junctions 810, the number of the second plurality of upstream thermocouple junctions 812, the number of the third plurality of upstream thermocouple junctions 816, the number of the fourth plurality of upstream thermocouple junctions 818, the number of the fifth plurality of upstream thermocouple junctions 822, and the number of the sixth plurality of upstream thermocouple junctions 824 may depend (e.g., may be a function of) the Seebeck coefficients of the thermocouple materials in the thermocouples and the desired output voltage.

In some embodiments, the second thermopile 826 may comprise a plurality of downstream thermocouples disposed downstream of the centerline 804 of the heating structure 802. In some embodiments, the plurality of downstream thermocouples may comprise a first subset of the plurality of downstream thermocouples aligned substantially parallel to the centerline 804 of the heating structure 802, such as a first plurality of downstream parallel thermocouples 828 having a first plurality of downstream thermocouple junctions 830 (e.g., six thermocouple junctions) and a second plurality of downstream thermocouple junctions 832 (e.g., seven thermocouple junctions). In some embodiments, the plurality of downstream thermocouples may further comprise a second subset of the plurality of downstream thermocouples aligned substantially perpendicular to the centerline 804 of the heating structure 802, such as a plurality of downstream perpendicular thermocouples 834 having a third plurality of downstream thermocouple junctions 836 (e.g., eleven thermocouple junctions) and a fourth plurality of downstream thermocouple junctions 838 (e.g., twelve thermocouple junctions). In some embodiments, the plurality of downstream thermocouples may comprise a third subset of the plurality of downstream thermocouples aligned substantially parallel to the centerline 804 of the heating structure 802, such as a second plurality of downstream parallel thermocouples 840 having a fifth plurality of downstream thermocouple junctions 842 (e.g., six thermocouple junctions) and a sixth plurality of downstream thermocouple junctions 844

(e.g., six thermocouple junctions). In some embodiments, the second thermopile 826 may not be disposed over the heating structure 802. In some embodiments, the number of the first plurality of downstream thermocouple junctions 830, the number of the second plurality of downstream thermocouple junctions 832, the number of the third plurality of downstream thermocouple junctions 836, the number of the fourth plurality of downstream thermocouple junctions 838, the number of the fifth plurality of downstream thermocouple junctions 842, and the number of the sixth plurality of downstream thermocouple junctions 844 may depend (e.g., may be a function of) the Seebeck coefficients of the thermocouple materials in the thermocouples and the desired output voltage.

In some embodiments, each of the second plurality of upstream thermocouple junctions 812, the fourth plurality of upstream thermocouple junctions 818, the sixth plurality of upstream thermocouple junctions 824, the second plurality of downstream thermocouple junctions 832, the fourth plurality of downstream thermocouple junctions 838, and the sixth plurality of downstream thermocouple junctions 844 may be disposed above the bulk substrate (e.g., bulk silicon) and may be at the same temperature and thus serve as a reference for measurements.

In some embodiments, each of the first plurality of upstream thermocouple junctions 810, the second plurality of upstream thermocouple junctions 812, the third plurality of upstream thermocouple junctions 816, the fourth plurality of upstream thermocouple junctions 818, the fifth plurality of upstream thermocouple junctions 822, the sixth plurality of upstream thermocouple junctions 824, the first plurality of downstream thermocouple junctions 830, the second plurality of downstream thermocouple junctions 832, the third plurality of downstream thermocouple junctions 836, the fourth plurality of downstream thermocouple junctions 838, the fifth plurality of downstream thermocouple junctions 842, and the sixth plurality of downstream thermocouple junctions 844 may comprise a respective interface between a first thermocouple material and a second thermocouple material as described in greater detail with reference to FIG. 11.

In some embodiments, as shown in FIG. 8, the example thermopile-based flow sensing device 800 may comprise a substrate defining a membrane structure 856. In some embodiments, a portion of the heating structure 802 may be disposed over the membrane structure 856. In some embodiments, the plurality of upstream thermocouples, the first subset of the plurality of upstream thermocouples, the first plurality of upstream parallel thermocouples 808, the first plurality of upstream thermocouple junctions 810, the second plurality of upstream thermocouple junctions 812, the second subset of the plurality of upstream thermocouples, the plurality of upstream perpendicular thermocouples 814, the third plurality of upstream thermocouple junctions 816, the fourth plurality of upstream thermocouple junctions 818, the third subset of the plurality of upstream thermocouples, the second plurality of upstream parallel thermocouples 820, the fifth plurality of upstream thermocouple junctions 822, the sixth plurality of upstream thermocouple junctions 824, the second thermopile 826, the plurality of downstream thermocouples, the first subset of the plurality of downstream thermocouples, the first plurality of downstream parallel thermocouples 828, the first plurality of downstream thermocouple junctions 830, the second plurality of downstream thermocouple junctions 832, the second subset of the plurality of downstream thermocouples, the downstream perpendicular thermocouples 834, the third plurality of downstream thermocouple junctions 836, the fourth plurality of downstream thermocouple junctions 838, the third subset of the plurality of downstream thermocouples, the second plurality of downstream parallel thermocouples 840, the fifth plurality of downstream thermocouple junctions 842, the sixth plurality of downstream thermocouple junctions 844, one or more portions thereof, or a combination thereof may be disposed over the membrane structure 856. For example, as shown in FIG. 8, a portion of the first thermopile 806 may be disposed over the membrane structure 856 such that: the first plurality of upstream thermocouple junctions 810 may be disposed over the membrane structure 856, and the second plurality of upstream thermocouple junctions 812 may not be disposed over the membrane structure 856; the third plurality of upstream thermocouple junctions 816 may be disposed over the membrane structure 856, and the fourth plurality of upstream thermocouple junctions 818 may not be disposed over the membrane structure 856; and the fifth plurality of upstream thermocouple junctions 822 may be disposed over the membrane structure 856, and the sixth plurality of upstream thermocouple junctions 824 may not be disposed over the membrane structure 856. In another example, as shown in FIG. 8, a portion of the second thermopile 826 may be disposed over the membrane structure 856 such that: the first plurality of downstream thermocouple junctions 830 may be disposed over the membrane structure 856, and the second plurality of downstream thermocouple junctions 832 may not be disposed over the membrane structure 856; the third plurality of downstream thermocouple junctions 836 may be disposed over the membrane structure 856, and the fourth plurality of downstream thermocouple junctions 838 may not be disposed over the membrane structure 856; and the fifth plurality of downstream thermocouple junctions 842 may be disposed over the membrane structure 856, and the sixth plurality of downstream thermocouple junctions 844 may not be disposed over the membrane structure 856. In some embodiments, the membrane structure 856 may provide thermal isolation from the bulk (e.g., silicon) die, which may have a high thermal conductivity. In some embodiments, the shape of the membrane structure 856 may be rectangular, square, circular, oval, or any other suitable shape or combination thereof.

FIGS. 9A, 9B, 9C, 9D, 9E, 9F, 9G, 9H, 9I, 9J, 9K, 9L, 9M, 9N, 9O, 9P, 9Q, 9R, 9S, and 9T illustrate an example process flow for fabricating an example thermopile-based flow sensing device in accordance with some example embodiments described herein.

As shown in FIG. 9A, at step 900 the process flow may begin with fabricating (e.g., by thermal oxidation) a silicon dioxide (SiO2) layer 932A on the top surface of a substrate 930 (e.g., a silicon die or wafer) and a silicon dioxide layer 932B on the bottom surface of the substrate 930.

As shown in FIG. 9B, at step 902 the process flow may continue to fabricating (e.g., by deposition, such as by sputtering) a silicon nitride layer 936 (e.g., Si3N4) on the top surface of the silicon dioxide layer 932A.

Figure 9C:
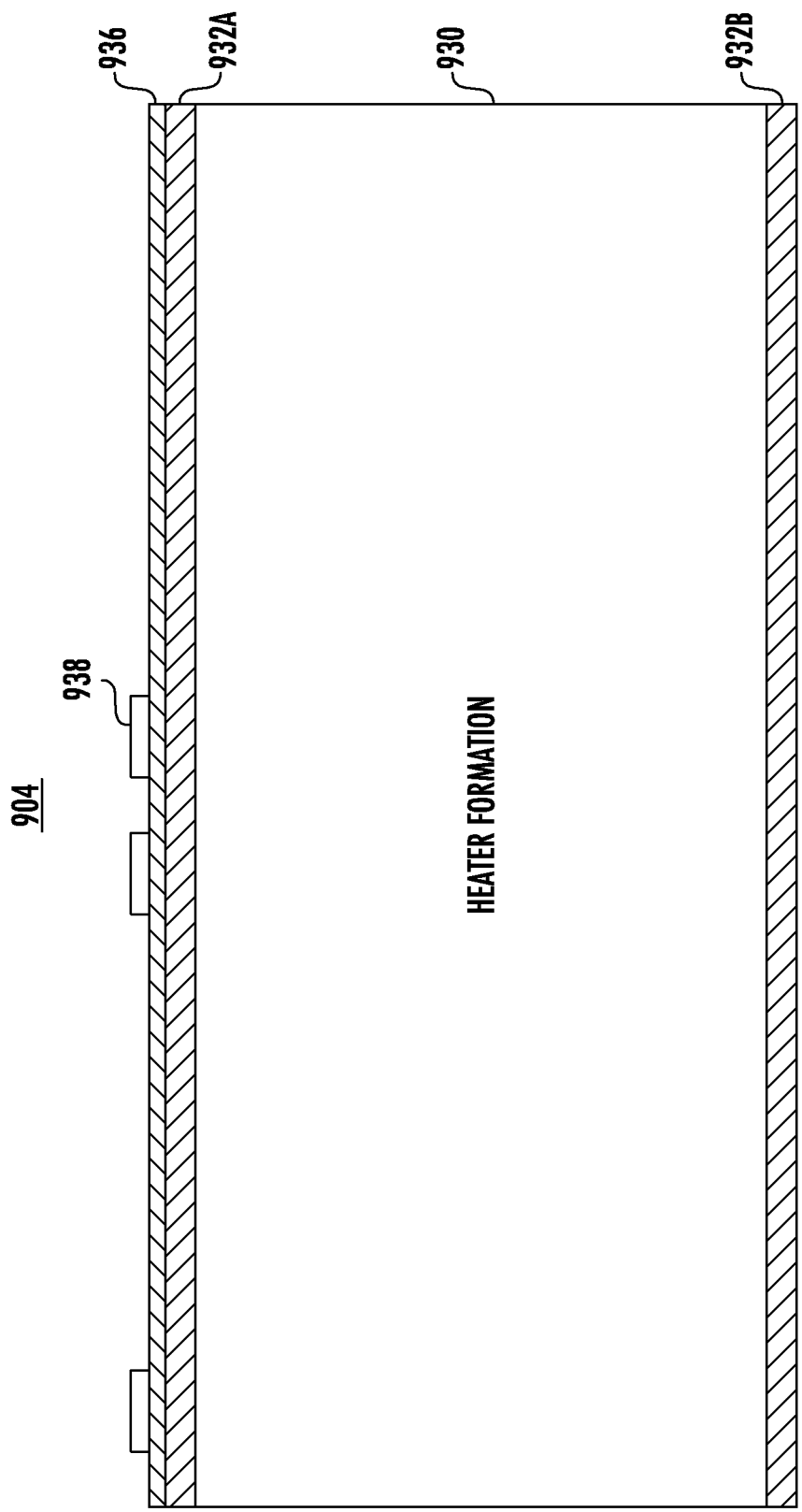

As shown in FIG. 9C, at step 904 the process flow may continue to fabricating (e.g., by deposition and patterning) a heater layer (e.g., TaN/NiFe/TaN) defining a heating structure 938 on the top surface of the silicon nitride layer 936.

Figure 9D:
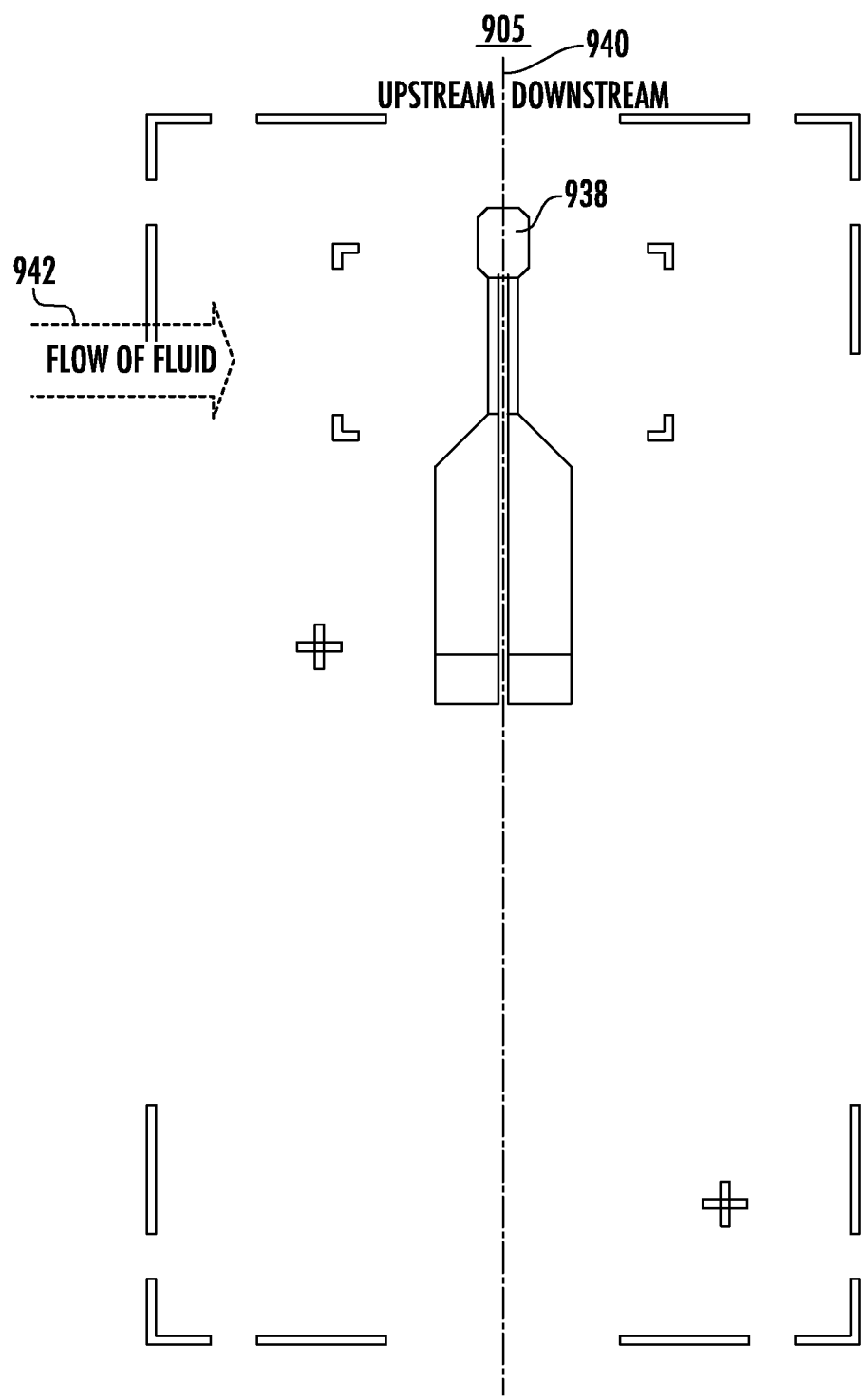

FIG. 9D illustrates an example layout for the example thermopile-based flow sensing device 905 fabricated at step 904. In some embodiments, the example thermopile-based flow sensing device 905 may be provided for sensing a flow of fluid 942 (e.g., a flow of a gas or liquid). In some embodiments, the example thermopile-based flow sensing device 905 may comprise a heating structure 938 having a centerline 940.

Figure 9E:
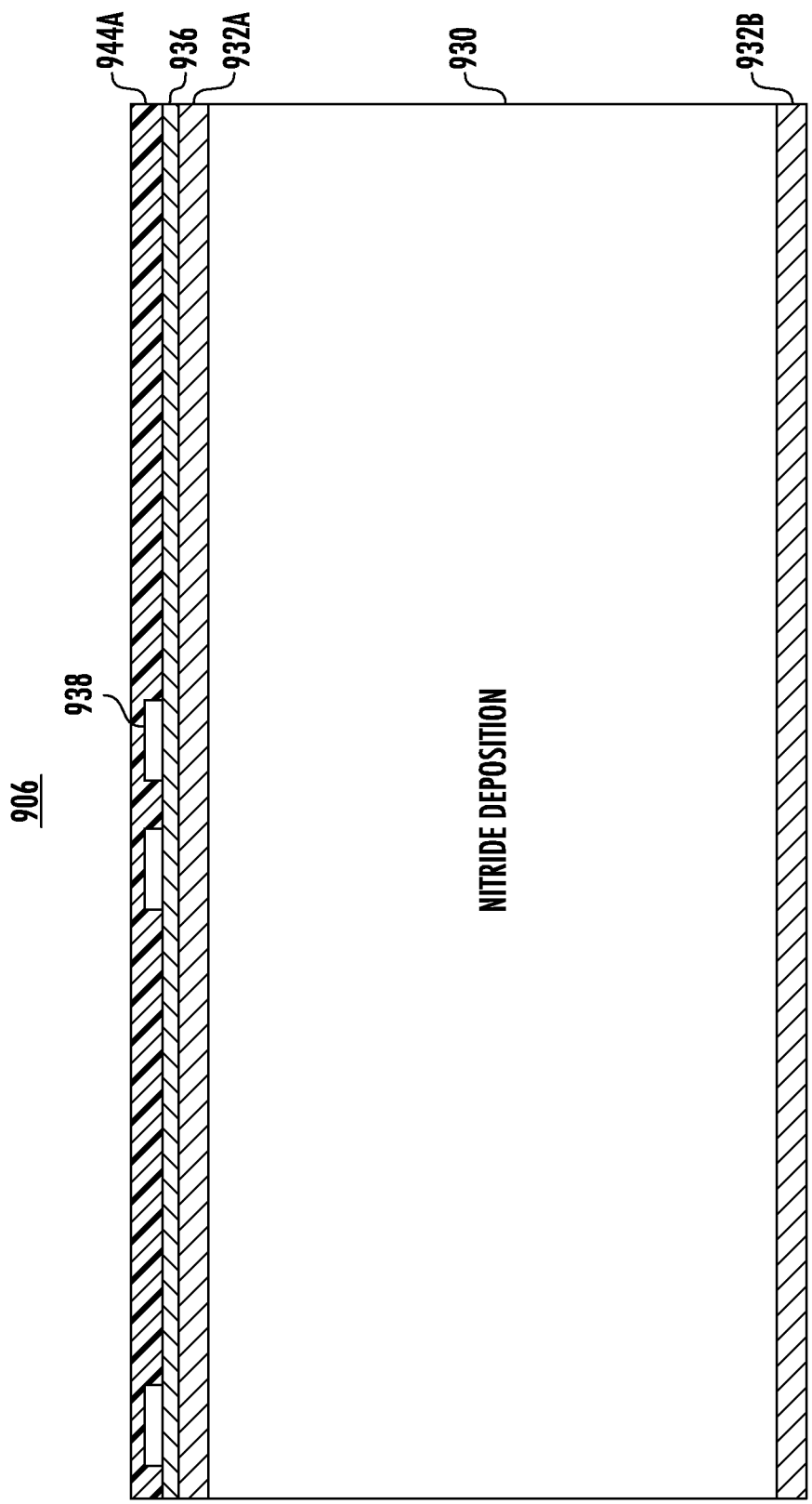

As shown in FIG. 9E, at step 906 the process flow may continue to fabricating (e.g., by deposition, such as by sputtering) a silicon nitride layer 944A (e.g., Si3N4) on the top surface of the silicon nitride layer 936 and the heater layer defining the heating structure 938.

Figure 9F:
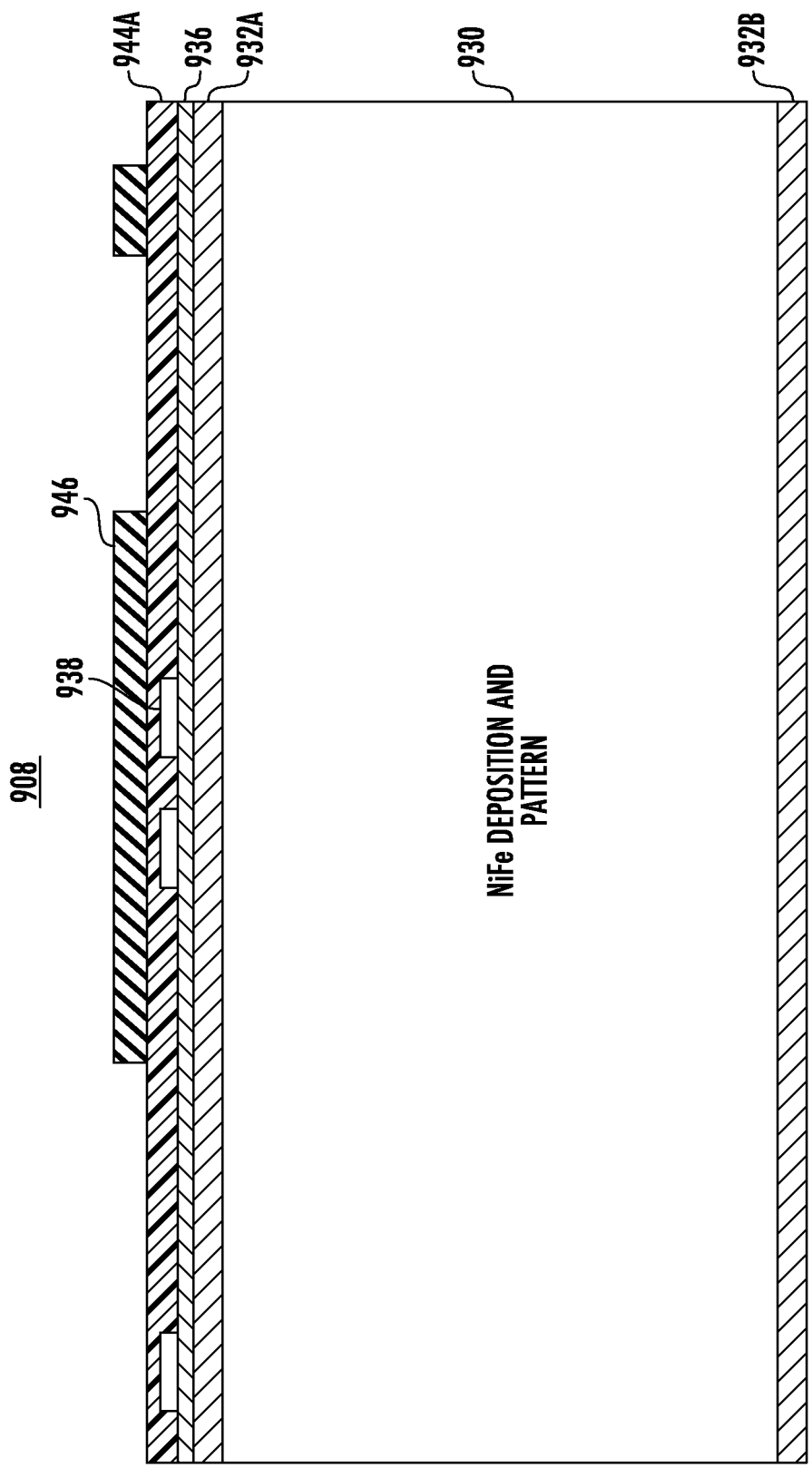

As shown in FIG. 9F, at step 908 the process flow may continue to fabricating (e.g., by deposition and patterning) a first thermocouple material layer 946 (e.g., 60:40 NiFe, 80:20 NiFe) on the top surface of the silicon nitride layer 944A.

Figure 9G:
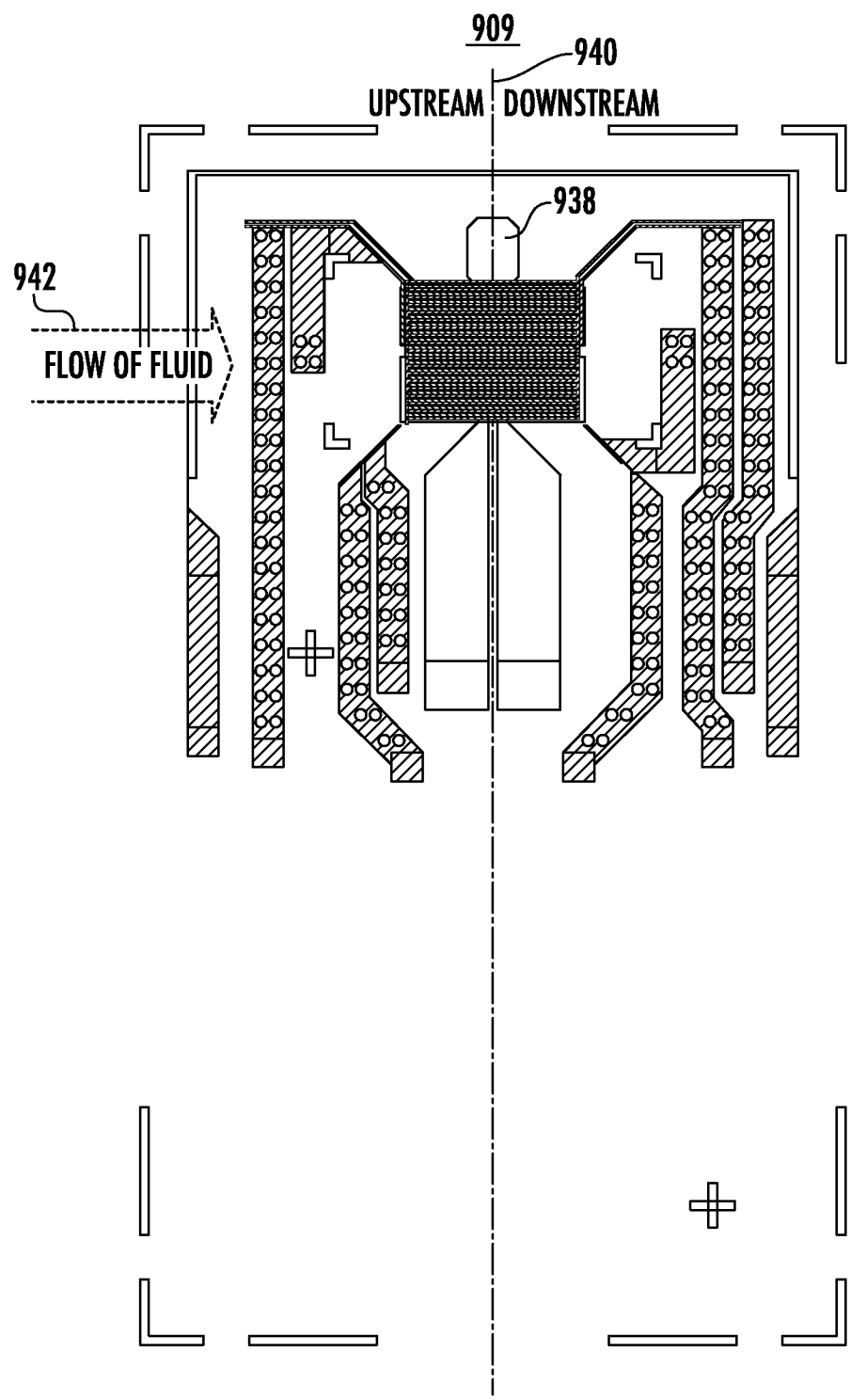

FIG. 9G illustrates an example layout for the example thermopile-based flow sensing device 909 fabricated at step 908.

Figure 9H:
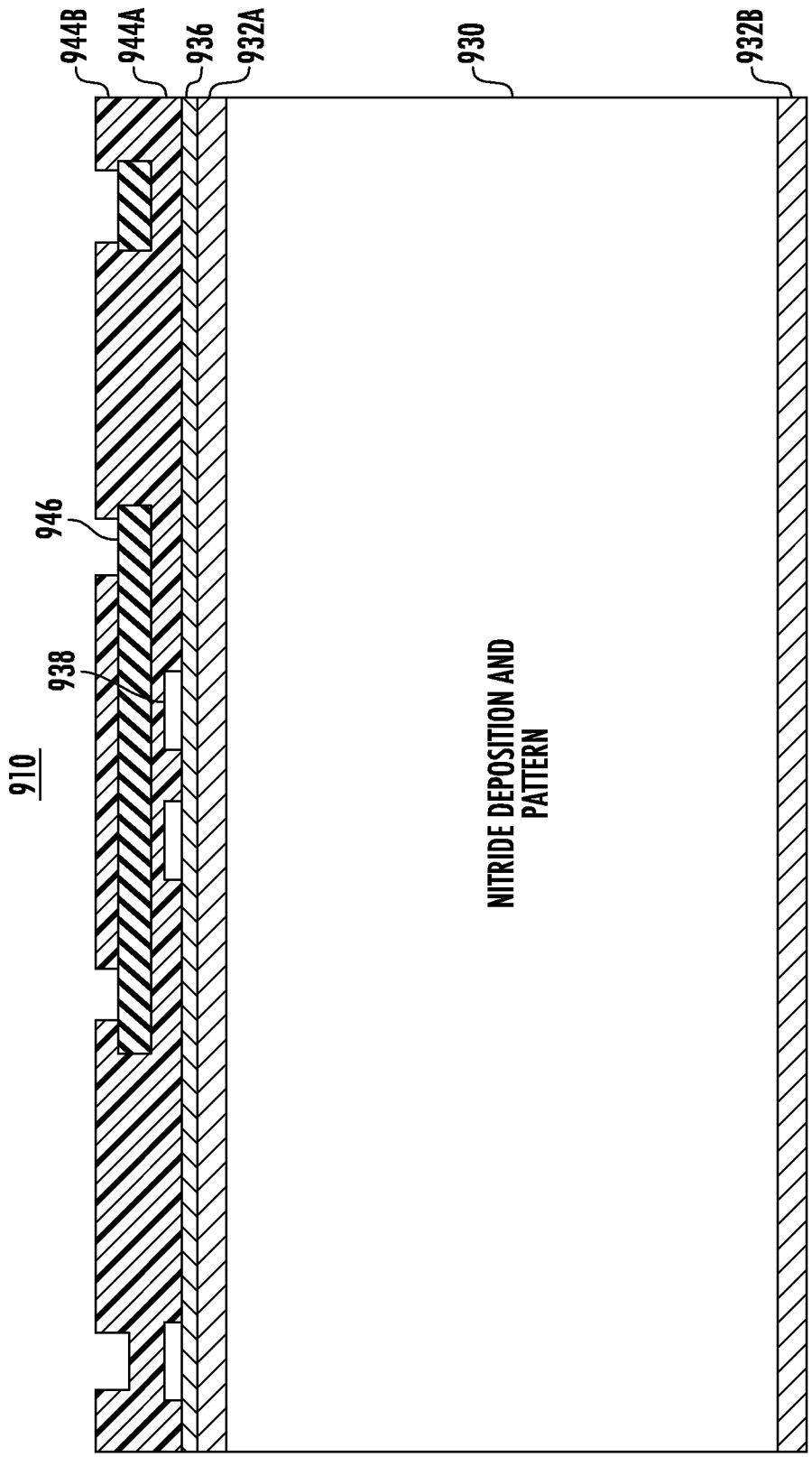

As shown in FIG. 9H, at step 910 the process flow may continue to fabricating (e.g., by deposition, such as by sputtering, and patterning) a silicon nitride layer 944B (e.g., Si3N4) on the top surface of the silicon nitride layer 944A and the first thermocouple material layer 946 and opening contact vias in the silicon nitride layer 944B to provide access to the top surface of the first thermocouple material layer 946.

Figure 9I:
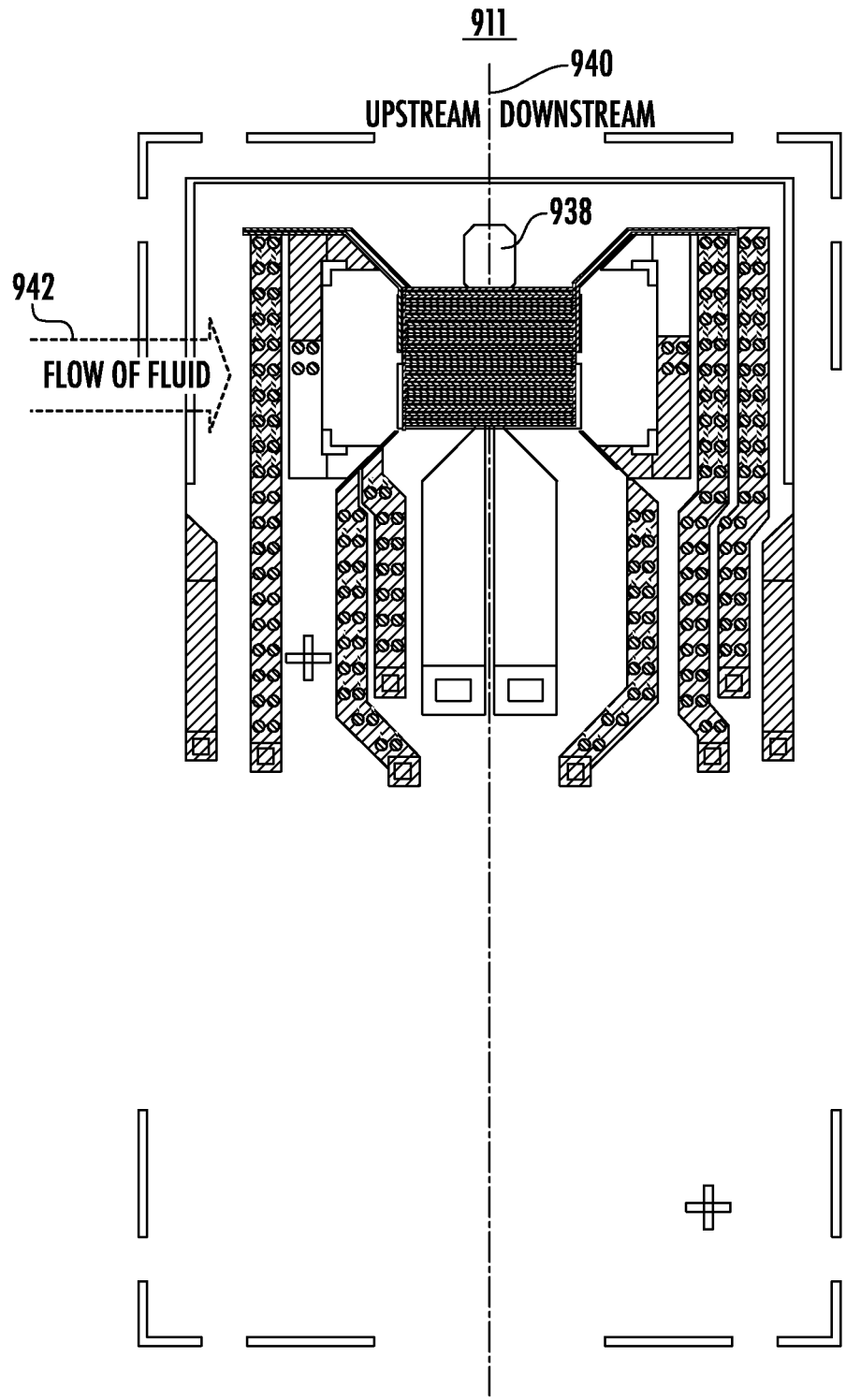

FIG. 9I illustrates an example layout for the example thermopile-based flow sensing device 911 fabricated at step 910.

Figure 9J:
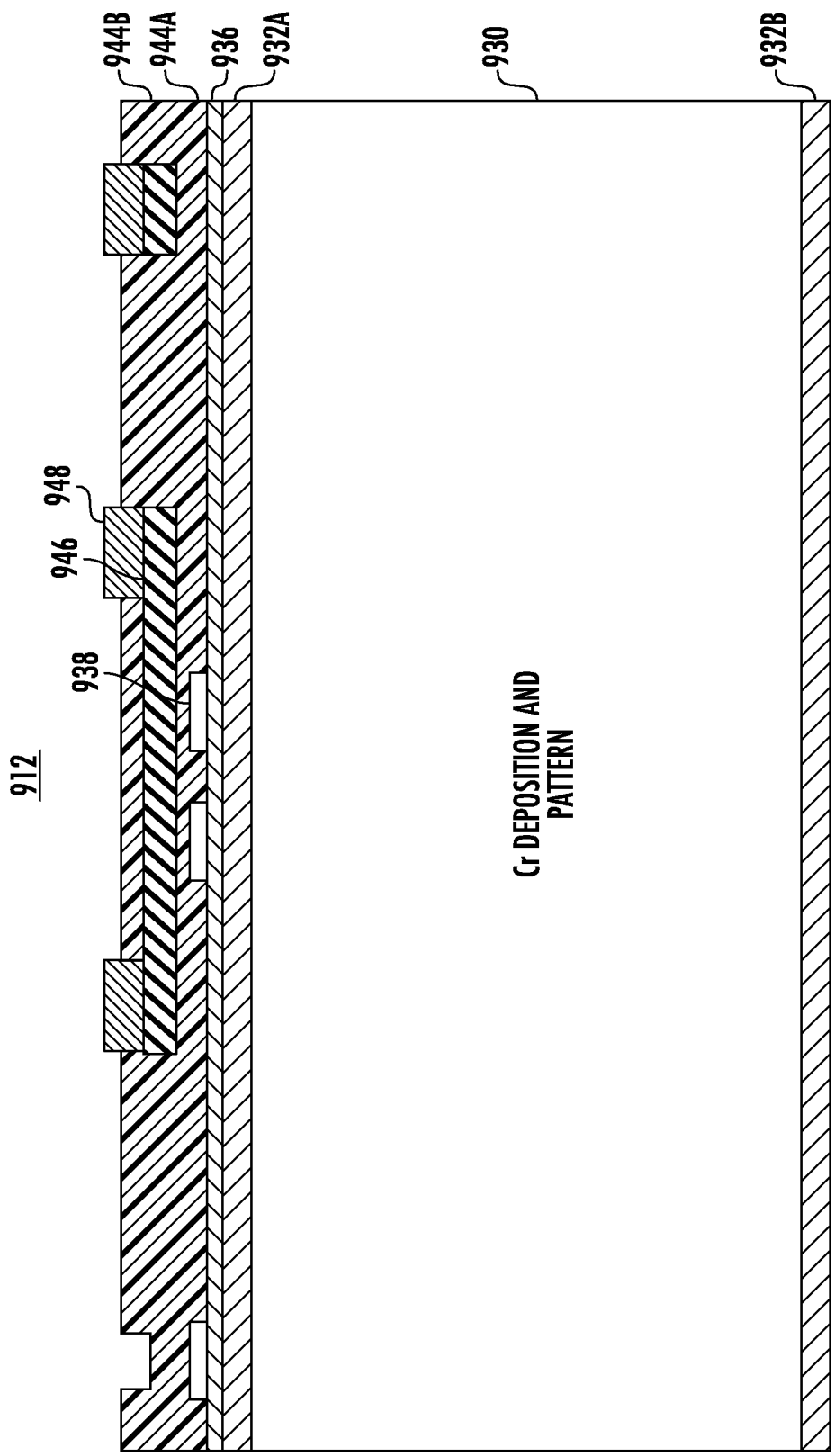

As shown in FIG. 9J, at step 908 the process flow may continue to fabricating (e.g., by deposition and patterning) a second thermocouple material layer 948 (e.g., Cr) on the top surface of the first thermocouple material layer 946 through contact windows opened in the silicon nitride layer 944B.

Figure 9K:
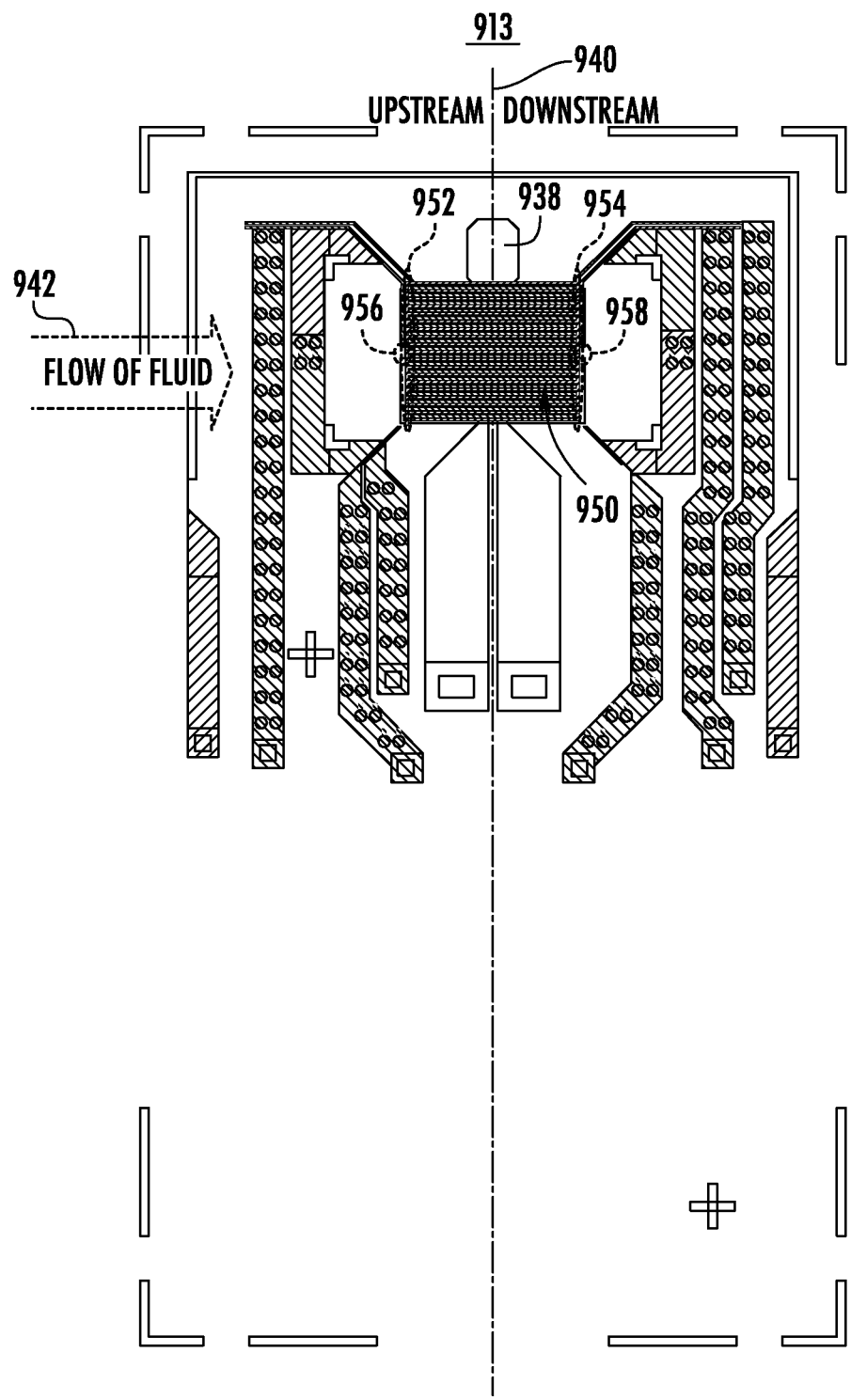

FIG. 9K illustrates an example layout for the example thermopile-based flow sensing device 913 fabricated at step 912. In some embodiments, the example thermopile-based flow sensing device 913 may be provided for sensing a flow of fluid 942 (e.g., a flow of a gas or liquid). In some embodiments, the example thermopile-based flow sensing device 913 may comprise a heating structure 938 having a centerline 940. In some embodiments, the example thermopile-based flow sensing device 913 may further comprise a thermopile 950. In some embodiments, at least a portion of the thermopile 950 may be disposed over the heating structure 938.

In some embodiments, the thermopile 950 may comprise a plurality of thermocouples having a plurality of thermocouple junctions. In some embodiments, the plurality of thermocouples may have a plurality of upstream thermocouple junctions 952 (e.g., nineteen upstream thermocouple junctions) disposed upstream of the centerline 940 of the heating structure 938. In some embodiments, the plurality of thermocouples may have a plurality of downstream thermocouple junctions 954 (e.g., nineteen downstream thermocouple junctions) disposed downstream of the centerline 940 of the heating structure 938. In some embodiments, the number of upstream thermocouple junctions 952 and the number of downstream thermocouple junctions 954 may be the same. In some embodiments, the number of upstream thermocouple junctions 952 and the number of downstream thermocouple junctions 954 may depend (e.g., may be a function of) the Seebeck coefficient of the first thermocouple material layer 946, the Seebeck coefficient of the second thermocouple material layer 948, and the desired output voltage.

In some embodiments, each of the plurality of upstream thermocouple junctions 952 and the plurality of downstream thermocouple junctions 954 may be aligned parallel to centerline 940 and occur along an upstream vertical line through about a minimum temperature difference location (e.g., minimum temperature difference location 222 shown in FIGS. 2A and 2B) and a downstream vertical line through about a maximum temperature difference location (e.g., maximum temperature difference location 224 shown in FIGS. 2A and 2B), respectively. For example, a maximum temperature difference may be defined by a minimum temperature difference located at a first location (e.g., minimum temperature difference location 222 FIGS. 2A and 2B) upstream of the centerline 940 and a maximum temperature difference located at a second location (e.g., maximum temperature difference location 224 shown in FIGS. 2A and 2B) downstream of the centerline 940; the plurality of upstream thermocouple junctions 952 may be disposed upstream of the centerline 940 at about a first plurality of points on a first line that extends through about the first location and is aligned substantially parallel to the centerline 940; and the plurality of downstream thermocouple junctions 954 may be disposed downstream of the centerline 940 at about a second plurality of points on a second line that extends through about the second location and is aligned substantially parallel to the centerline 940. In some embodiments, the plurality of upstream thermocouple junctions 952 and the plurality of downstream thermocouple junctions 954 may not be disposed over the heating structure 938.

In some embodiments, the example thermopile-based flow sensing device 913 may further comprise a plurality of upstream sample temperature sensing thermocouple junctions 956 (e.g., two upstream sample temperature sensing thermocouple junctions) disposed upstream of the centerline 940 of the heating structure 938. In some embodiments, the example thermopile-based flow sensing device 913 may further comprise a plurality of downstream sample temperature sensing thermocouple junctions 958 (e.g., two downstream sample temperature sensing thermocouple junctions) disposed downstream of the centerline 940 of the heating structure 938. In some embodiments, the plurality of upstream sample temperature sensing thermocouple junctions 956 and the plurality of downstream sample temperature sensing thermocouple junctions 958 may not be disposed over the heating structure 938.

In some embodiments, each of the plurality of upstream thermocouple junctions 952, the plurality of downstream thermocouple junctions 954, the plurality of upstream sample temperature sensing thermocouple junctions 956, and the plurality of downstream sample temperature sensing thermocouple junctions 958 may comprise a respective interface between a first thermocouple material and a second thermocouple material as described in greater detail with reference to FIGS. 9J and 11.

As shown in FIG. 9L, at step 914 the process flow may continue to fabricating (e.g., by deposition, such as by sputtering, and patterning) a silicon nitride layer 944C (e.g., Si3N4) on the top surface of the silicon nitride layer 944B and the second thermocouple material layer 948 and opening contact vias in the silicon nitride layer 944C to provide access to the top surface of the second thermocouple material layer 948.

Figure 9M:
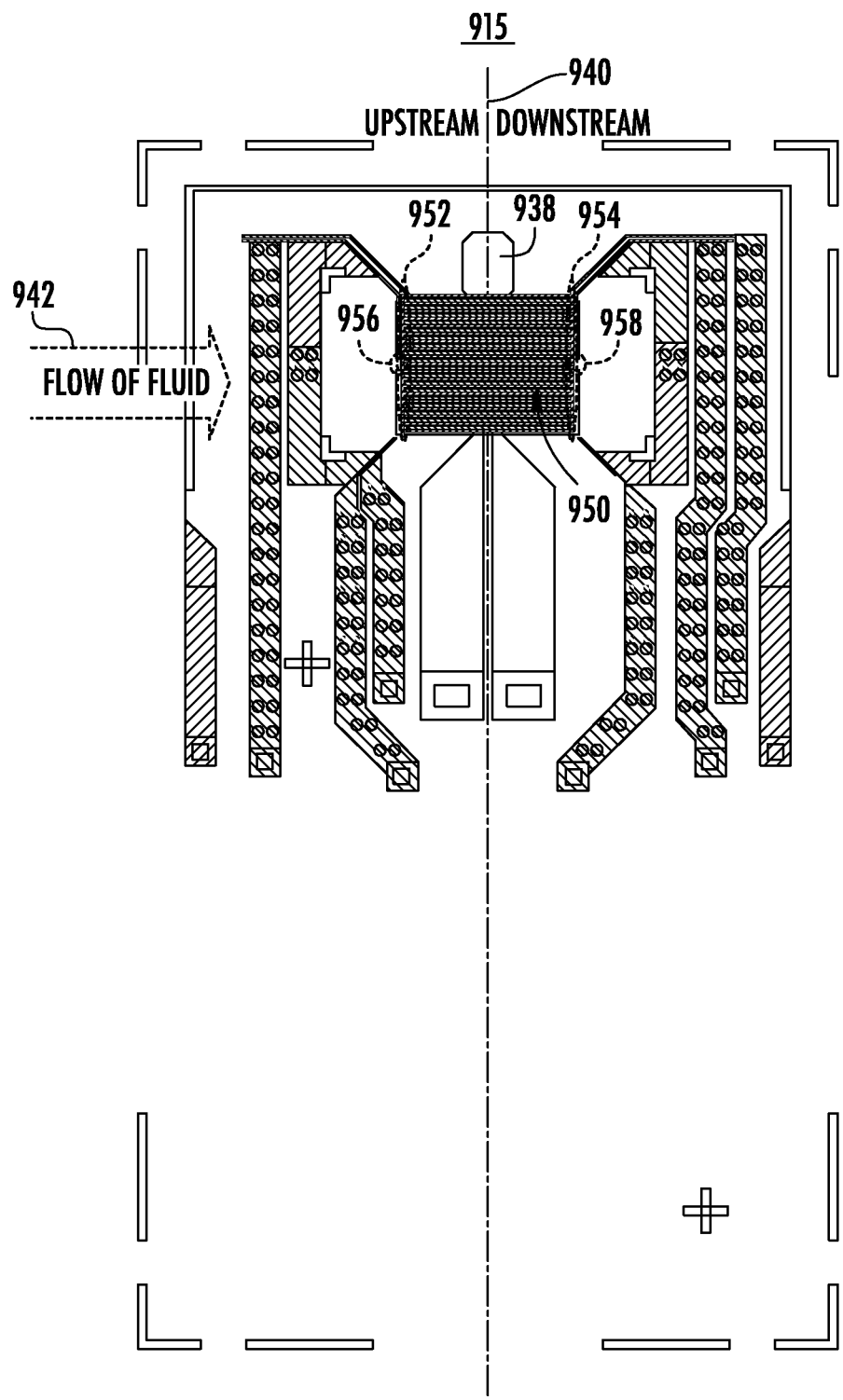
Figure 90:
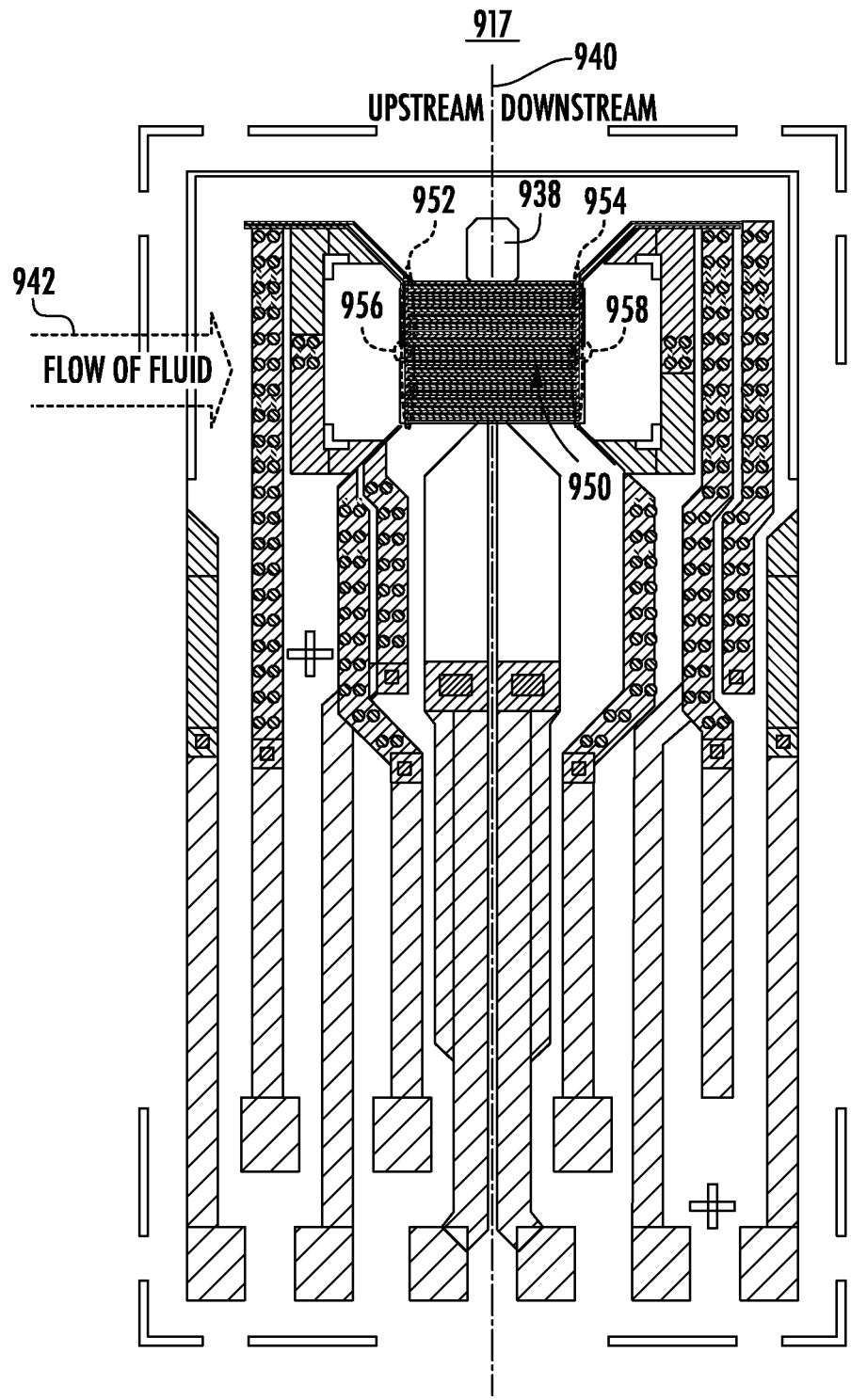

FIG. 9M illustrates an example layout for the example thermopile-based flow sensing device 915 fabricated at step 914.

As shown in FIG. 9N, at step 916 the process flow may continue to fabricating (e.g., by deposition and patterning) an electrical contact layer 960 (e.g., TiW/Al, TiW/2% Al—

Cu) on the top surface of the second thermocouple material layer 948 through the contact vias opened in the silicon nitride layer 944C.

FIG. 9O illustrates an example layout for the example thermopile-based flow sensing device 917 fabricated at step 916.

Figure 9P:
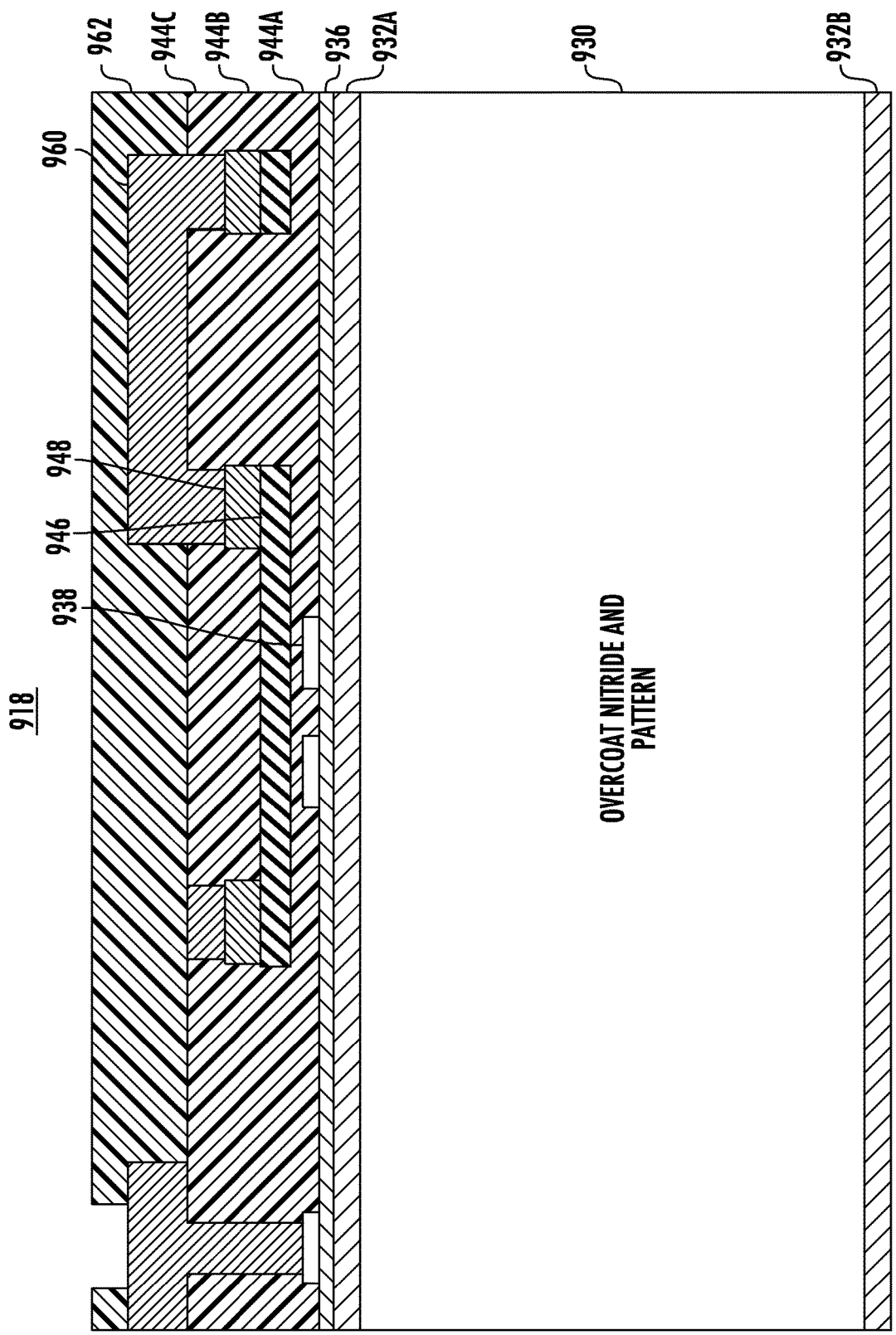

As shown in FIG. 9P, at step 918 the process flow may continue to fabricating (e.g., by plasma enhanced chemical vapor deposition (PECVD)) a silicon nitride overcoat layer 962 (e.g., $Si_xN_y$—H) on the top surface of the silicon nitride layer 944C and the electrical contact layer 960 and opening contact vias in the silicon nitride overcoat layer 962 to provide access to the top surface of the electrical contact layer 960.

Figure 9Q:
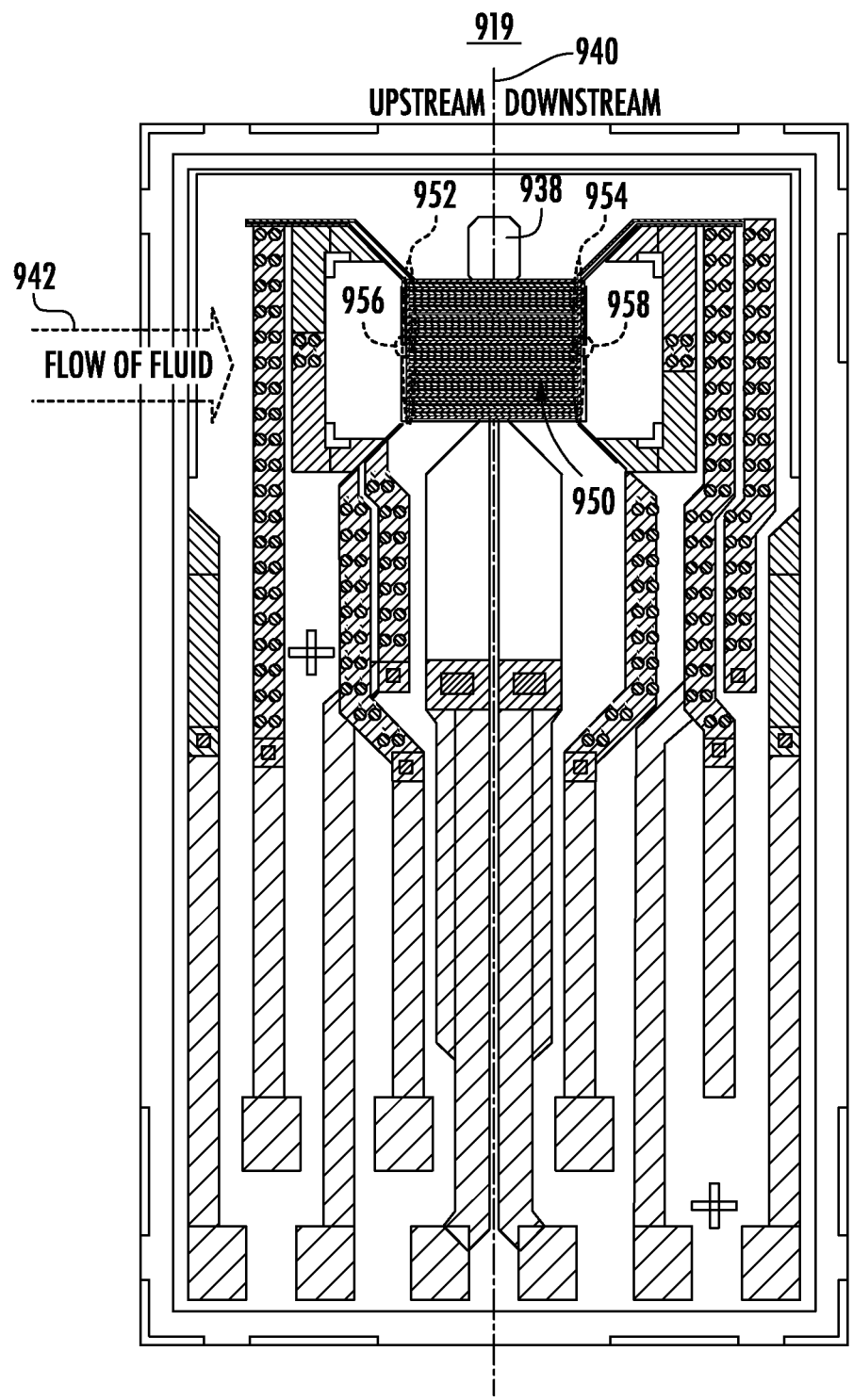

FIG. 9Q illustrates an example layout for the example thermopile-based flow sensing device 919 fabricated at step 918.

Figure 9R:
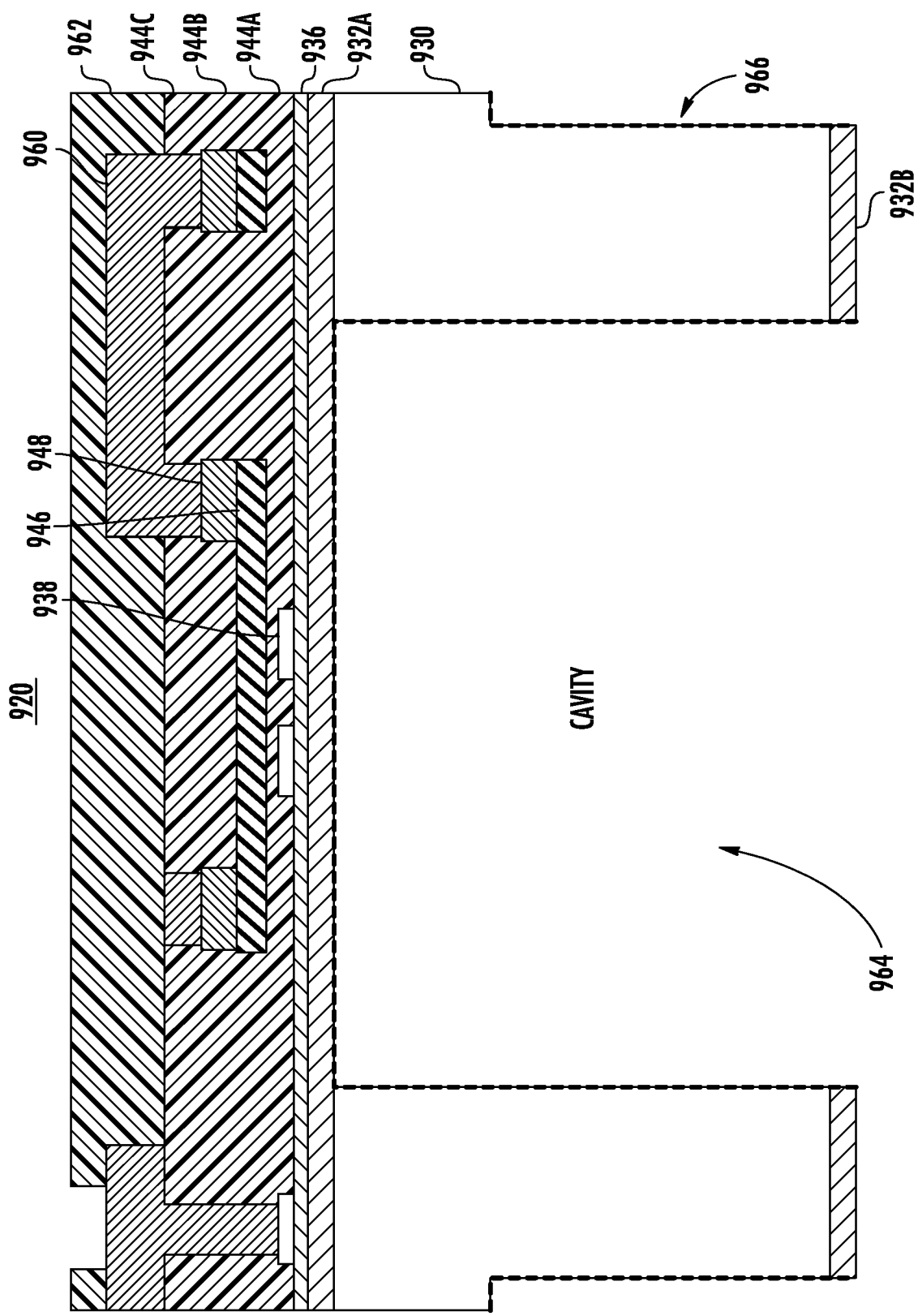

As shown in FIG. 9R, at step 920 the process flow may continue to fabricating a membrane structure by forming (e.g., by DRIE) a cavity 964 through the silicon dioxide layer 932B and the substrate 930 until reaching the bottom surface of the silicon dioxide layer 932A. At step 920 the process flow may include forming (e.g., by DRIE) one or more side cavities 966 through the silicon dioxide layer 932B and a portion of the substrate 930 (e.g., through 70% of the thickness of the substrate 930).

Figure 9S:
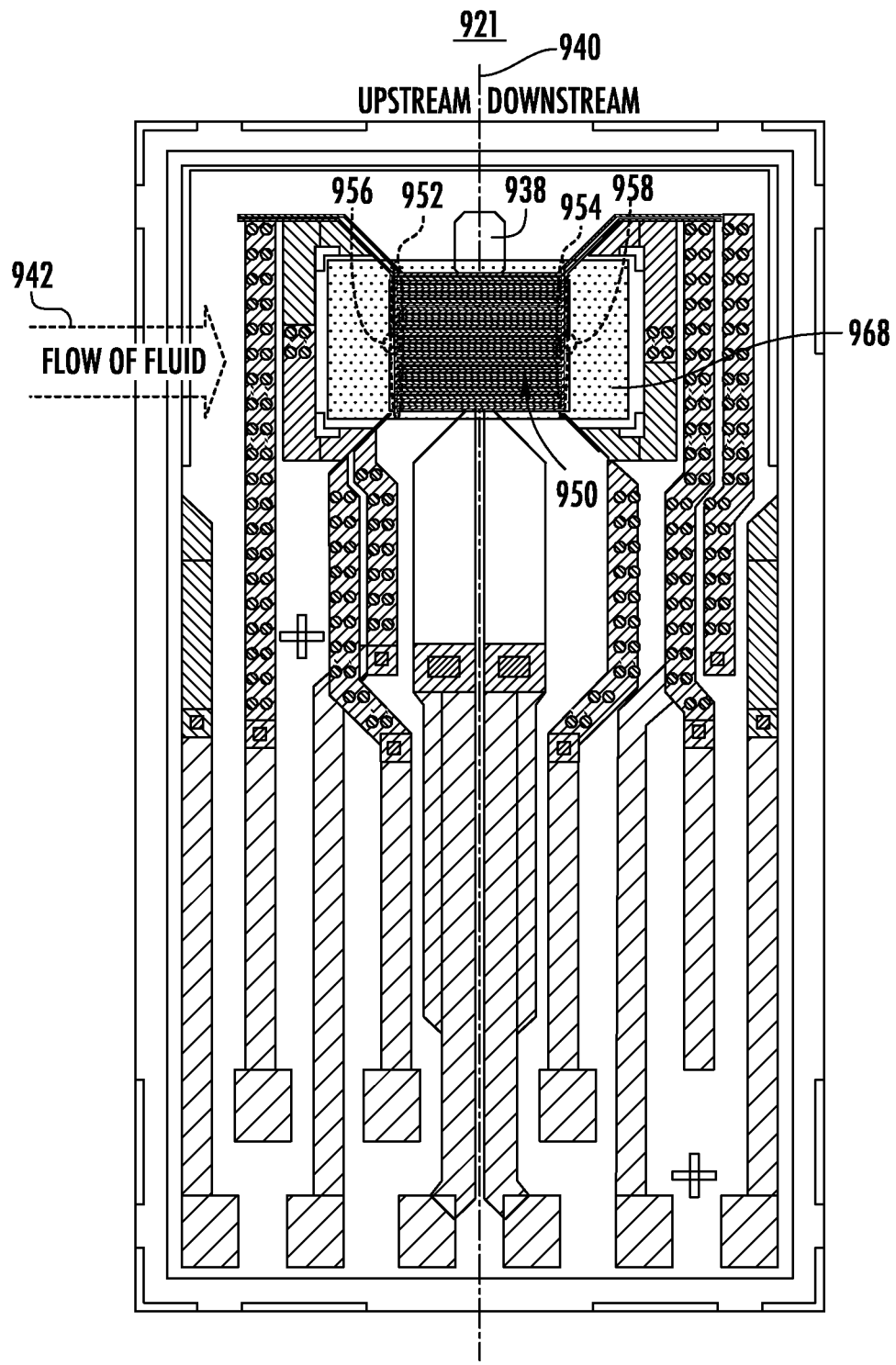

FIG. 9S illustrates an example layout for the example thermopile-based flow sensing device 921 fabricated at step 920. In some embodiments, the example thermopile-based flow sensing device 921 may comprise a substrate defining a membrane structure 968. In some embodiments, a portion of the heating structure 938 may be disposed over the membrane structure 968. In some embodiments, the thermopile 950, the plurality of thermocouples, the plurality of upstream thermocouple junctions 952, the plurality of downstream thermocouple junctions 954, the plurality of upstream sample temperature sensing thermocouple junctions 956, the plurality of downstream sample temperature sensing thermocouple junctions 958, one or more portions thereof, or a combination thereof may be disposed over the membrane structure 968. In some embodiments, the membrane structure 968 may provide thermal isolation from the substrate 930, which may have a high thermal conductivity. In some embodiments, the shape of the membrane structure 968 may be rectangular, square, circular, oval, or any other suitable shape or combination thereof.

In other embodiments (not shown in FIG. 9 for the sake of brevity), the example thermopile-based flow sensing device 921 may comprise a substrate defining a microbridge structure. In some embodiments, a portion of the heating structure 938 may be disposed over the microbridge structure. In some embodiments, the thermopile 950, the plurality of thermocouples, the plurality of upstream thermocouple junctions 952, the plurality of downstream thermocouple junctions 954, the plurality of upstream sample temperature sensing thermocouple junctions 956, the plurality of downstream sample temperature sensing thermocouple junctions 958, one or more portions thereof, or a combination thereof may be disposed over the microbridge structure.

Figure 9T:
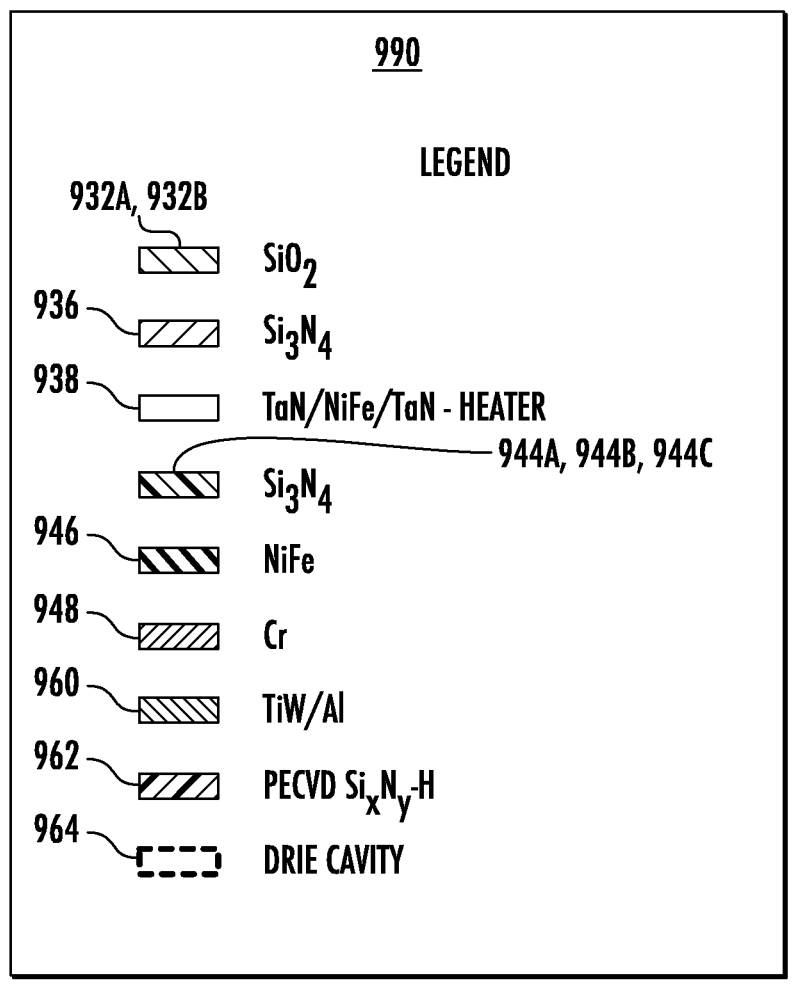

FIG. 9T illustrates a legend for the various example layers described with reference to FIGS. 9A, 9B, 9C, 9E, 9F, 9H, 9J, 9L, 9N, 9P, and 9R.

Figure 10:
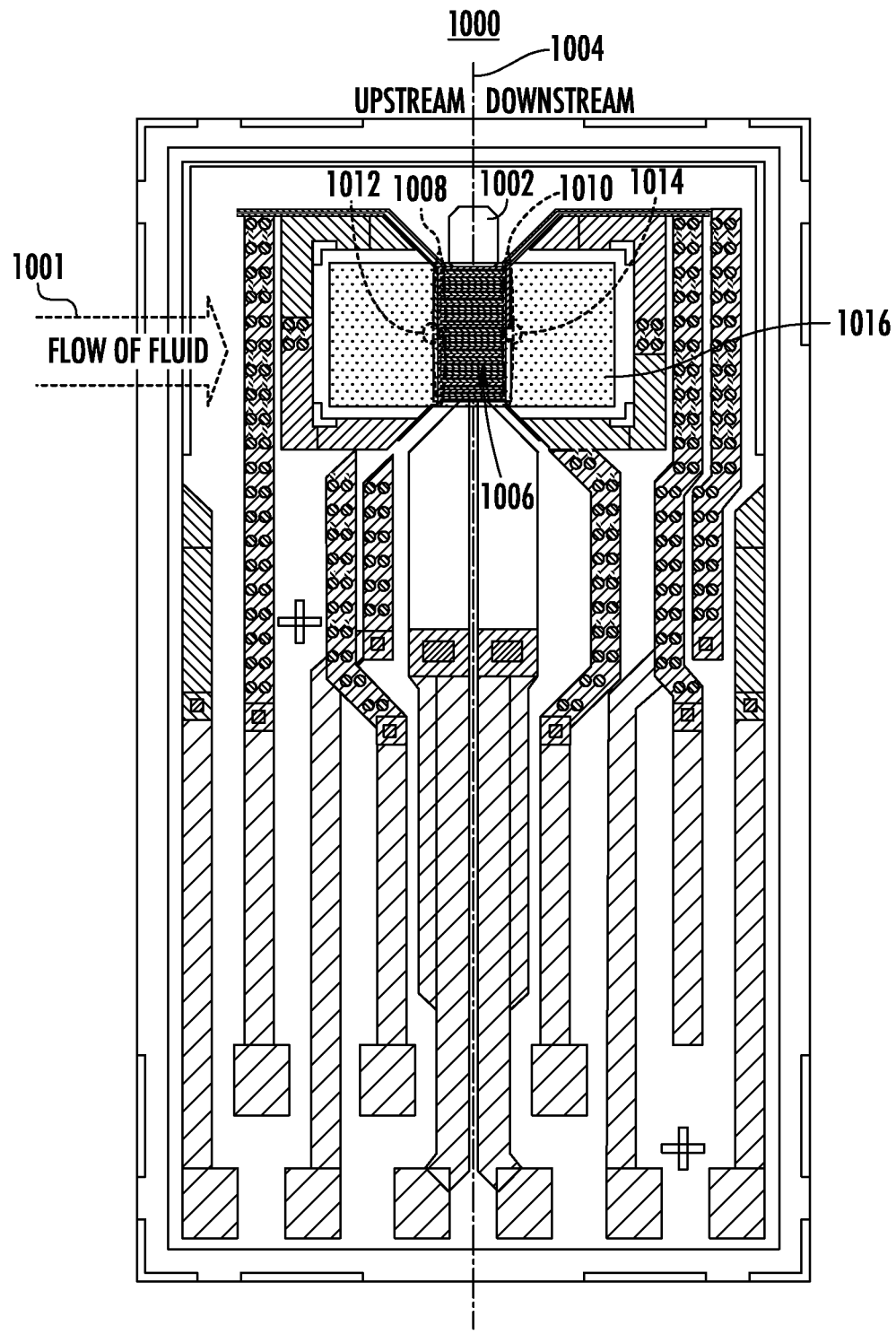
FIG. 10 illustrates another example layout for an example thermopile-based flow sensing device in accordance with some example embodiments described herein.

FIG. 10 illustrates an example layout for an example thermopile-based flow sensing device 1000 in accordance with some example embodiments described herein. In some embodiments, the example thermopile-based flow sensing device 1000 may be provided for sensing a flow of fluid 1001 (e.g., a flow of a gas or liquid). In some embodiments, the example thermopile-based flow sensing device 1000 may comprise a heating structure 1002 having a centerline 1004. In some embodiments, the example thermopile-based flow sensing device 1000 may further comprise a thermopile 1006. In some embodiments, at least a portion of the thermopile 1006 may be disposed over the heating structure 1002.

In some embodiments, the thermopile 1006 may comprise a plurality of thermocouples having a plurality of thermocouple junctions. In some embodiments, the plurality of thermocouples may have a plurality of upstream thermocouple junctions 1008 (e.g., nineteen upstream thermocouple junctions) disposed upstream of the centerline 1004 of the heating structure 1002. In some embodiments, the plurality of thermocouples may have a plurality of downstream thermocouple junctions 1010 (e.g., nineteen downstream thermocouple junctions) disposed downstream of the centerline 1004 of the heating structure 1002. In some embodiments, the plurality of upstream thermocouple junctions 1008 and the plurality of downstream thermocouple junctions 1010 may not be disposed over the heating structure 1002. In some embodiments, the number of upstream thermocouple junctions 1008 and the number of downstream thermocouple junctions 1010 may be the same. In some embodiments, the number of upstream thermocouple junctions 1008 and the number of downstream thermocouple junctions 1010 may depend (e.g., may be a function of) the Seebeck coefficients of the thermocouple materials in the thermocouples and the desired output voltage.

In some embodiments, the example thermopile-based flow sensing device 1000 may further comprise a plurality of upstream sample temperature sensing thermocouple junctions 1012 (e.g., two upstream sample temperature sensing thermocouple junctions) disposed upstream of the centerline 1004 of the heating structure 1002. In some embodiments, the example thermopile-based flow sensing device 1000 may further comprise a plurality of downstream sample temperature sensing thermocouple junctions 1014 (e.g., two downstream sample temperature sensing thermocouple junctions) disposed downstream of the centerline 1004 of the heating structure 1002. In some embodiments, the plurality of upstream sample temperature sensing thermocouple junctions 1012 and the plurality of downstream sample temperature sensing thermocouple junctions 1014 may not be disposed over the heating structure 1002.

In some embodiments, each of the plurality of upstream thermocouple junctions 1008, the plurality of downstream thermocouple junctions 1010, the plurality of upstream sample temperature sensing thermocouple junctions 1012, and the plurality of downstream sample temperature sensing thermocouple junctions 1014 may comprise a respective interface between a first thermocouple material and a second thermocouple material as described in greater detail with reference to FIG. 11.

In some embodiments, as shown in FIG. 10, the example thermopile-based flow sensing device 1000 may comprise a substrate defining a membrane structure 1016. In some embodiments, a portion of the heating structure 1002 may be disposed over the membrane structure 1016. In some embodiments, the thermopile 1006, the plurality of thermocouples, the plurality of upstream thermocouple junctions 1008, the plurality of downstream thermocouple junctions 1010, the plurality of upstream sample temperature sensing thermocouple junctions 1012, the plurality of downstream sample temperature sensing thermocouple junctions 1014, one or more portions thereof, or a combination thereof may be disposed over the membrane structure 1016. In some embodiments, the membrane structure 1016 may provide thermal isolation from the bulk (e.g., silicon) die, which may have a high thermal conductivity. In some embodiments, the shape of the membrane structure 1016 may be rectangular, square, circular, oval, or any other suitable shape or combination thereof.

In other embodiments (not shown in FIG. 10 for the sake of brevity), the example thermopile-based flow sensing device 1000 may comprise a substrate defining a microbridge structure. In some embodiments, a portion of the heating structure 1002 may be disposed over the microbridge structure. In some embodiments, the thermopile 1006, the plurality of thermocouples, the plurality of upstream thermocouple junctions 1008, the plurality of downstream thermocouple junctions 1010, the plurality of upstream sample temperature sensing thermocouple junctions 1012, the plurality of downstream sample temperature sensing thermocouple junctions 1014, one or more portions thereof, or a combination thereof may be disposed over the microbridge structure.

FIG. 11 illustrates an example table 1100 of thermocouple materials for use in an example thermopile-based flow sensing device in accordance with some example embodiments described herein. For example, the thermocouple materials shown in example table 1100 may be used to provide a thermocouple junction comprising an interface between a first thermocouple material and a second thermocouple material. In some embodiments, the number of thermocouple junctions in the thermopile of an example thermopile-based flow sensing device disclosed herein may depend (e.g., may be a function of) the Seebeck coefficients of the thermocouple materials in the thermocouples of the thermopile and the desired output voltage. The term "dS" refers to the difference between the Seebeck coefficients of the thermocouple materials in a thermocouple.

In some embodiments, the first thermocouple material may comprise polysilicon, and the second thermocouple material may comprise aluminum. In some embodiments, the first thermocouple material and the second thermocouple material may comprise differently doped polysilicon (e.g., n-type and p-type polysilicon). For example, the first thermocouple material may comprise n-type polysilicon (nPoly Si), and the second thermocouple material may comprise p-type polysilicon (pPoly Si). In another example, the first thermocouple material may comprise p-type polysilicon (pPoly Si), and the second thermocouple material may comprise n-type polysilicon (nPoly Si).

In some embodiments, the first thermocouple material may comprise a nickel-iron alloy (e.g., 60:40 NiFe, 80:20 NiFe), and the second thermocouple material may comprise chromium (Cr), where dS is about 65 uV/C for 60:40 NiFe and Cr or about 53 uV/C for 80:20 NiFe and Cr. In some embodiments, the first thermocouple material may comprise a nickel-iron alloy (e.g., 60:40 NiFe, 80:20 NiFe), and the second thermocouple material may comprise chromium disilicide (CrSi2), where dS is about 105 uV/C for 60:40 NiFe and CrSi2 or about 93 uV/C for 80:20 NiFe and CrSi2. In some embodiments, the first thermocouple material may comprise a nickel-iron alloy (e.g., 60:40 NiFe, 80:20 NiFe), and the second thermocouple material may comprise rhenium disilicide (ReSi2).

In some embodiments, the first thermocouple material may comprise chromium nitride (e.g., CrN), and the second thermocouple material may comprise copper (Cu), where dS is about 146 uV/C for CrN and Cu. In some embodiments, the first thermocouple material may comprise chromium nitride (e.g., CrN), and the second thermocouple material may comprise aluminum (Al), where dS is about 138 uV/C for CrN and Al. In some embodiments, the first thermocouple material may comprise a chromium nitride (e.g., CrN), and the second thermocouple material may comprise p-type polysilicon (pPoly Si), where dS is about 270 uV/C for CrN and pPoly Si.

In some embodiments, the first thermocouple material may comprise copper (Cu), and the second thermocouple material may comprise a copper-nickel alloy (e.g., Constantan).

In some embodiments, the thermopile-based flow sensing device disclosed herein may comprise any combination of components, structures, and features discussed with reference to example thermopile-based flow sensing devices 100, 200, 300, 400, 500, 600, 700, 800, and 1000, and any of the example thermopile-based flow sensing devices described with reference to FIG. 9 (e.g., example thermopile-based flow sensing devices 913, 915, 917, 919, 921), including the addition or omission of components, structures, and features.

Having described specific components of example devices involved in the present disclosure, example procedures for providing a thermopile-based flow sensing device are described below in connection with FIGS. 12 and 13.

FIG. 12 illustrates an example flowchart 1200 that contains example operations for manufacturing or otherwise providing an apparatus (e.g., apparatus 100, 200, 300, 400, 500, 600, 913, 915, 917, 919, 921, 1000) for sensing a flow of fluid according to some example embodiments described herein.

As shown by operation 1202, the example flowchart 1200 may begin by providing a heating structure (e.g., heating structure 102, 202, 302, 402, 502, 602, 938, 1002) having a centerline (e.g., centerline 104, 204, 304, 404, 504, 604, 940, 1004).

As shown by operation 1204, the example flowchart 1200 may proceed to disposing at least a portion of a thermopile (e.g., thermopile 106, 206, 306, 406, 506, 606, 950, 1006) over the heating structure. The thermopile may comprise a first thermocouple having a first thermocouple junction (e.g., one of the one or more upstream thermocouple junctions 108, 308, 408, 508, 608, 952, 1008) disposed upstream of the centerline of the heating structure. The thermopile may further comprise a second thermocouple having a second thermocouple junction (e.g., one of the one or more downstream thermocouple junctions 110, 310, 410, 510, 610, 954, 1010) disposed downstream of the centerline of the heating structure. In some embodiments, the number of upstream thermocouple junctions and the number of downstream thermocouple junctions in the thermopile may depend (e.g., may be a function of) the Seebeck coefficients of the thermocouple materials in the thermocouples and the desired output voltage.

In some embodiments, operations 1202 and 1204 may not necessarily occur in the order depicted in FIG. 12. In some embodiments, one or more of the operations depicted in FIG. 12 may occur substantially simultaneously. In some embodiments, one or more additional operations may be involved before, after, or between any of the operations shown in FIG. 12.

Figure 13:
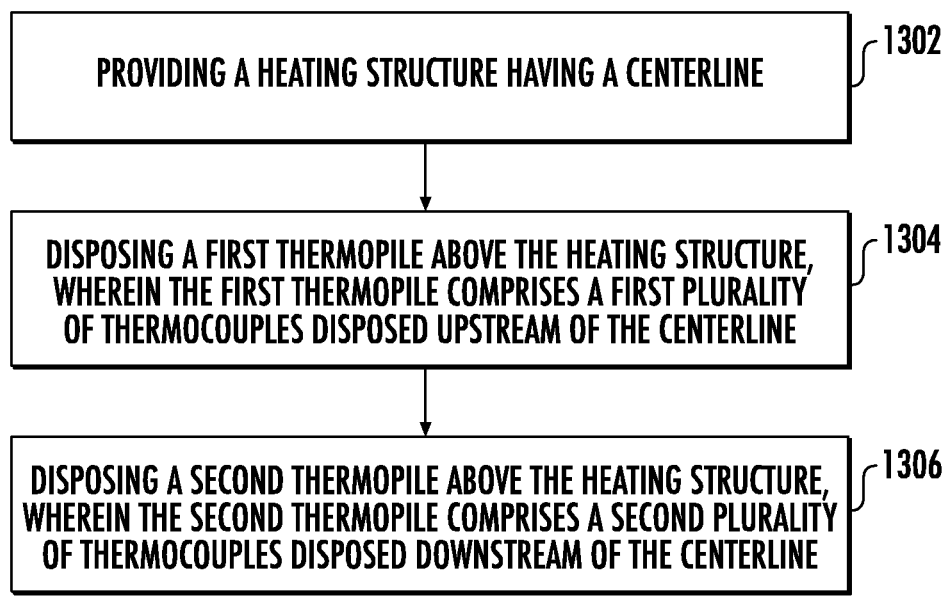
FIG. 13 illustrates an example flowchart illustrating another example method in accordance with some example embodiments described herein.

FIG. 13 illustrates an example flowchart 1300 that contains example operations for manufacturing or otherwise providing an apparatus (e.g., apparatus 700, 800) for sensing a flow of fluid according to some example embodiments described herein.

As shown by operation 1302, the example flowchart 1300 may begin by providing a heating structure (e.g., heating structure 702, 802) having a centerline (e.g., centerline 704, 804).

As shown by operation 1304, the example flowchart 1300 may proceed to disposing a first thermopile (e.g., thermopile 706, 806) upstream of the centerline of the heating structure. The first thermopile may comprise a first plurality of thermocouples disposed upstream of the centerline of the heating structure. In some embodiments, the first plurality of thermocouples may comprise a first subset of the first plurality of thermocouples (e.g., upstream parallel thermocouples 808, 820) aligned substantially parallel to the centerline of the heating structure. In some embodiments, the first plurality of thermocouples may further comprise a second subset of the first plurality of thermocouples (e.g., upstream perpendicular thermocouples 814) aligned substantially perpendicular to the centerline of the heating structure. In some instances, the first thermopile may be disposed above the heating structure, such as in a layer above the heating structure but not over the heating structure.

As shown by operation 1306, the example flowchart 1300 may proceed to disposing a second thermopile (e.g., thermopile 710, 826) downstream of the centerline of the heating structure. The second thermopile may comprise a second plurality of thermocouples disposed downstream of the centerline of the heating structure. In some embodiments, the second plurality of thermocouples may comprise a third subset of the second plurality of thermocouples (e.g., downstream parallel thermocouples 828, 840) aligned substantially parallel to the centerline of the heating structure. In some embodiments, the second plurality of thermocouples may further comprise a fourth subset of the second plurality of thermocouples (e.g., downstream perpendicular thermocouples 834) aligned substantially perpendicular to the centerline of the heating structure. In some instances, the second thermopile may be disposed above the heating structure, such as in a layer above the heating structure but not over the heating structure.

In some embodiments, operations 1302, 1304, and 1306 may not necessarily occur in the order depicted in FIG. 13. In some embodiments, one or more of the operations depicted in FIG. 13 may occur substantially simultaneously. In some embodiments, one or more additional operations may be involved before, after, or between any of the operations shown in FIG. 13.

FIGS. 12 and 13 thus illustrate example flowcharts describing operations performed in accordance with example embodiments of the present disclosure. It will be understood that each operation of the flowcharts, and combinations of operations in the flowcharts, may be implemented by various means, such as devices comprising hardware, firmware, one or more processors, and/or circuitry associated with execution of software comprising one or more computer program instructions. In some embodiments, one or more of the procedures described above may be performed by execution of program code instructions. For example, one or more of the procedures described above may be performed by material handling equipment (e.g., a robotic arm, servo motor, motion controllers, and the like) and computer program instructions residing on a non-transitory computer-readable storage memory. In this regard, the program code instructions that, when executed, cause performance of the procedures described above may be stored by a non-transitory computer-readable storage medium (e.g., memory) of a computing apparatus and executed by a processor of the computing apparatus. In this regard, the computer program instructions which embody the procedures described above may be stored by a memory of an apparatus employing an embodiment of the present disclosure and executed by a processor of the apparatus. As will be appreciated, any such computer program instructions may be loaded onto a computer or other programmable apparatus (e.g., hardware) to produce a machine, such that the resulting computer or other programmable apparatus provides for implementation of the functions specified in the flowcharts 1200 and 1300. When executed, the instructions stored in the computer-readable storage memory produce an article of manufacture configured to implement the various functions specified in the flowcharts 1200 and 1300. The program code instructions may also be loaded onto a computer or other programmable apparatus to cause a series of operations to be performed on the computer or other programmable apparatus to produce a computer-implemented process such that the instructions executed on the computer or other programmable apparatus provide operations for implementing the functions specified in the operations of flowcharts 1200 and 1300. Moreover, execution of a computer or other processing circuitry to perform various functions converts the computer or other processing circuitry into a particular machine configured to perform an example embodiment of the present disclosure.

The flowchart operations described with reference to FIGS. 12 and 13 support combinations of means for performing the specified functions and combinations of operations for performing the specified functions. It will be understood that one or more operations of the flowcharts, and combinations of operations in the flowcharts, may be implemented by special purpose hardware-based computer systems which perform the specified functions, or combinations of special purpose hardware and computer instructions.

In some example embodiments, certain ones of the operations herein may be modified or further amplified as described below. Moreover, in some embodiments additional optional operations may also be included. It should be appreciated that each of the modifications, optional additions or amplifications described herein may be included with the operations herein either alone or in combination with any others among the features described herein.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," and similar words are not intended to limit the order of the steps; these words are simply used to guide the reader through the description of the methods. Further, any reference to claim elements in the singular, for example, using the articles "a," "an" or "the," is not to be construed as limiting the element to the singular and may, in some instances, be construed in the plural.

As described above and as will be appreciated based on this disclosure, embodiments of the present disclosure may be configured as systems, apparatuses, methods, mobile devices, backend network devices, computer program products, other suitable devices, and combinations thereof. Accordingly, embodiments may comprise various means including entirely of hardware or any combination of software with hardware. Furthermore, embodiments may take the form of a computer program product on at least one non-transitory computer-readable storage medium having computer-readable program instructions (e.g., computer software) embodied in the storage medium. Any suitable computer-readable storage medium may be utilized including non-transitory hard disks, CD-ROMs, flash memory, optical storage devices, or magnetic storage devices. As will be appreciated, any computer program instructions and/or other type of code described herein may be loaded onto a computer, processor or other programmable apparatus's circuitry to produce a machine, such that the computer, processor, or other programmable circuitry that executes the code on the machine creates the means for implementing various functions, including those described herein. In some embodiments, features of the present disclosure may comprise, or be communicatively coupled to, an application specific integrated circuit (ASIC) configured to convert the differential output voltage from the thermopile or thermopiles (e.g., either in a single chip or two-chip configuration).

While various embodiments in accordance with the principles disclosed herein have been shown and described above, modifications thereof may be made by one skilled in the art without departing from the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present disclosure. Furthermore, any advantages and features described above may relate to specific embodiments, but shall not limit the application of such issued claims to processes and structures accomplishing any or all of the above advantages or having any or all of the above features.

In addition, the section headings used herein are provided for consistency with the suggestions under 37 C.F.R. § 1.77 or to otherwise provide organizational cues. These headings shall not limit or characterize the disclosure set out in any claims that may issue from this disclosure. For instance, a description of a technology in the "Background" is not to be construed as an admission that certain technology is prior art to any disclosure in this disclosure. Neither is the "Summary" to be considered as a limiting characterization of the disclosure set forth in issued claims. Furthermore, any reference in this disclosure to "disclosure" or "embodiment" in the singular should not be used to argue that there is only a single point of novelty in this disclosure. Multiple embodiments of the present disclosure may be set forth according to the limitations of the multiple claims issuing from this disclosure, and such claims accordingly define the disclosure, and their equivalents, that are protected thereby. In all instances, the scope of the claims shall be considered on their own merits in light of this disclosure, but should not be constrained by the headings set forth herein.

Also, systems, subsystems, apparatuses, techniques, and methods described and illustrated in the various embodiments as discrete or separate may be combined or integrated with other systems, modules, techniques, or methods without departing from the scope of the present disclosure. Other devices or components shown or discussed as coupled to, or in communication with, each other may be indirectly coupled through some intermediate device or component, whether electrically, mechanically, or otherwise. Other examples of changes, substitutions, and alterations are ascertainable by one skilled in the art and could be made without departing from the scope disclosed herein.

Many modifications and other embodiments of the disclosure set forth herein will come to mind to one skilled in the art to which these embodiments pertain having the benefit of teachings presented in the foregoing descriptions and the associated figures. Although the figures only show certain components of the apparatuses and systems described herein, various other components may be used in conjunction with the components and structures disclosed herein. Therefore, it is to be understood that the disclosure is not to be limited to the specific embodiments disclosed and that modifications and other embodiments are intended to be included within the scope of the appended claims. For example, the various elements or components may be combined, rearranged, or integrated in another system or certain features may be omitted or not implemented. Moreover, the steps in any method described above may not necessarily occur in the order depicted in the accompanying drawings, and in some cases one or more of the steps depicted may occur substantially simultaneously, or additional steps may be involved. Although specific terms are employed herein, they are used in a generic and descriptive sense only and not for purposes of limitation.

The invention claimed is:

1. An apparatus for sensing a flow of fluid, the apparatus comprising:
   a flow sensing device comprising:
      a heating structure having a centerline that defines upstream and downstream sections of the flow sensing device;
      a membrane structure;
      a first thermopile, wherein at least a portion of the first thermopile is disposed over the membrane structure, and wherein the first thermopile comprises:
         a first plurality of upstream thermocouple junctions disposed over the membrane structure, and
         a second plurality of upstream thermocouple junctions offset from the membrane structure; and
      a second thermopile, wherein at least a portion of the second thermopile is disposed over the membrane structure, and wherein the second thermopile comprises:
         a first plurality of downstream thermocouple junctions disposed over the membrane structure, and
         a second plurality of downstream thermocouple junctions not disposed over the membrane structure,
      wherein a maximum temperature difference is defined by a minimum temperature difference location located upstream of the centerline and a maximum temperature difference location located downstream of the centerline,
      wherein the maximum temperature difference location and the minimum temperature difference location are based on a temperature profile of the heat generated by the heating structure such that the locations of the maximum temperature difference location and the minimum temperature difference location are defined by at least an applied voltage to the heating structure,
      wherein the temperature profile of the heat generated by the heating structure is represented by a temperature isoline, wherein the temperature isoline has its longest dimension set forth on an x-axis,
wherein the centerline is a vertical centerline and the x-axis is perpendicular to the vertical centerline,
wherein the maximum and minimum temperature difference locations are located at the middle and farthest locations of the temperature isoline of the temperature profile of the heat generated by the heating structure,
wherein the first plurality of upstream thermocouple junctions is aligned substantially parallel to the centerline along an upstream vertical line through about the minimum temperature difference location, and
wherein the first plurality of downstream thermocouple junctions is aligned substantially parallel to the centerline along a downstream vertical line through about the maximum temperature difference location.

2. The apparatus of claim 1, further comprising a substrate defining a microbridge structure, wherein a portion of the heating structure is disposed over the microbridge structure.

3. The apparatus of claim 1, wherein the first plurality of upstream thermocouple junctions is disposed in the upstream section of the flow sensing device.

4. The apparatus of claim 3, wherein the second plurality of upstream thermocouple junctions is disposed in the upstream section of the flow sensing device, further upstream than the first plurality of upstream thermocouple junctions.

5. The apparatus of claim 1, wherein the first plurality of downstream thermocouple junctions is disposed in the downstream section of the flow sensing device.

6. The apparatus of claim 5, wherein the second plurality of downstream thermocouple junctions is disposed in the downstream section of the flow sensing device, further downstream than the first plurality of downstream thermocouple junctions.

7. The apparatus of claim 1, wherein the first and second pluralities of upstream thermocouple junctions and the first and second pluralities of downstream thermocouple junctions are disposed at about a plurality of locations on a maximum temperature difference isoline.

8. The apparatus of claim 1, wherein each of the first and second pluralities of upstream thermocouple junctions comprise a respective interface between a first thermocouple material and a second thermocouple material, wherein the first thermocouple material comprises polysilicon, and wherein the second thermocouple material comprises aluminum.

9. The apparatus of claim 1, wherein each of the first and second pluralities of upstream thermocouple junctions comprise a respective interface between a first thermocouple material and a second thermocouple material, wherein the first thermocouple material comprises n-type polysilicon, and wherein the second thermocouple material comprises p-type polysilicon.

10. The apparatus of claim 1, wherein each of the first and second pluralities of upstream thermocouple junctions comprise a respective interface between a first thermocouple material and a second thermocouple material, wherein the first thermocouple material comprises p-type polysilicon, and wherein the second thermocouple material comprises n-type polysilicon.

11. The apparatus of claim 1, wherein each of the first and second pluralities of upstream thermocouple junctions comprise a respective interface between a first thermocouple material and a second thermocouple material, wherein the first thermocouple material comprises a nickel-iron alloy, and wherein the second thermocouple material comprises chromium.

12. The apparatus of claim 1, wherein each of the first and second pluralities of upstream thermocouple junctions comprise a respective interface between a first thermocouple material and a second thermocouple material, wherein the first thermocouple material comprises a nickel-iron alloy, and wherein the second thermocouple material comprises chromium disilicide.

13. The apparatus of claim 1, wherein each of the first and second pluralities of upstream thermocouple junctions comprise a respective interface between a first thermocouple material and a second thermocouple material, wherein the first thermocouple material comprises a nickel-iron alloy, and wherein the second thermocouple material comprises rhenium disilicide.

14. The apparatus of claim 1, wherein each of the first and second pluralities of upstream thermocouple junctions comprise a respective interface between a first thermocouple material and a second thermocouple material, wherein the first thermocouple material comprises chromium nitride, and wherein the second thermocouple material comprises copper.

15. The apparatus of claim 1, wherein each of the first and second pluralities of upstream thermocouple junctions comprise a respective interface between a first thermocouple material and a second thermocouple material, wherein the first thermocouple material comprises chromium nitride, and wherein the second thermocouple material comprises aluminum.

16. The apparatus of claim 1, wherein each of the first and second pluralities of upstream thermocouple junctions comprise a respective interface between a first thermocouple material and a second thermocouple material, wherein the first thermocouple material comprises chromium nitride, and wherein the second thermocouple material comprises p-type polysilicon.

17. The apparatus of claim 1, wherein each of the first and second pluralities of upstream thermocouple junctions comprise a respective interface between a first thermocouple material and a second thermocouple material, wherein the first thermocouple material comprises copper, and wherein the second thermocouple material comprises a copper-nickel alloy.

18. The apparatus of claim 1, wherein each of the minimum temperature difference location and the maximum temperature difference location is further defined by at least one of a shape, a thickness, or a material of the heating structure.

19. A method for manufacturing an apparatus for sensing a flow of fluid, the method comprising:
providing a heating structure having a centerline that defines upstream and downstream sections of a flow sensing device;
forming a membrane structure;
providing a first thermopile, wherein at least a portion of the first thermopile is disposed over the membrane structure, and wherein the first thermopile comprises:
a first plurality of upstream thermocouple junctions disposed over the membrane structure, and
a second plurality of upstream thermocouple junctions offset from the membrane structure; and
providing a second thermopile, wherein at least a portion of the second thermopile is disposed over the membrane structure, and wherein the second thermopile comprises:

a first plurality of downstream thermocouple junctions disposed over the membrane structure, and a second plurality of downstream thermocouple junctions not disposed over the membrane structure, wherein a maximum temperature difference is defined by a minimum temperature difference location located upstream of the centerline and a maximum temperature difference location located downstream of the centerline, wherein the maximum temperature difference location and the minimum temperature difference location are based on a temperature profile of the heat generated by the heating structure such that the locations of the maximum temperature difference location and the minimum temperature difference location are defined by at least an applied voltage to the heating structure, wherein the temperature profile of the heat generated by the heating structure is represented by a temperature isoline, wherein the temperature isoline has its longest dimension set forth on an x-axis, wherein the centerline is a vertical centerline and the x-axis is perpendicular to the vertical centerline, wherein the maximum and minimum temperature difference locations are located at the middle and farthest locations of the temperature isoline of the temperature profile of the heat generated by the heating structure, wherein the first plurality of upstream thermocouple junctions is aligned substantially parallel to the centerline along an upstream vertical line through about the minimum temperature difference location, and wherein the first plurality of downstream thermocouple junctions is aligned substantially parallel to the centerline along a downstream vertical line through about the maximum temperature difference location.

* * * * *